US012757527B2

(12) United States Patent
Kawada et al.

(10) Patent No.: US 12,757,527 B2
(45) Date of Patent: Oct. 6, 2026

(54) ELECTRONIC STRUCTURE, MANUFACTURING METHOD OF ELECTRONIC STRUCTURE, AND MANUFACTURING METHOD OF ELECTRONIC DEVICE

(71) Applicant: Oki Electric Industry Co., Ltd., Tokyo (JP)

(72) Inventors: Hiroto Kawada, Tokyo (JP); Takuma Ishikawa, Tokyo (JP); Hironori Furuta, Tokyo (JP); Takahito Suzuki, Tokyo (JP); Kenichi Tanigawa, Tokyo (JP); Yusuke Nakai, Tokyo (JP); Yutaka Kitajima, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 363 days.

(21) Appl. No.: 18/417,257

(22) Filed: Jan. 19, 2024

(65) Prior Publication Data

US 2024/0332454 A1 Oct. 3, 2024

(30) Foreign Application Priority Data

Mar. 27, 2023 (JP) ................................. 2023-050073

(51) Int. Cl.
*H10H 20/82* (2025.01)
*H10H 20/01* (2025.01)

(52) U.S. Cl.
CPC ............ *H10H 20/82* (2025.01); *H10H 20/01* (2025.01)

(58) Field of Classification Search
CPC ...... H10H 20/82; H10H 20/01; H10H 20/018; H10P 95/11; H10P 72/74; H10F 71/139
See application file for complete search history.

(56) References Cited

U.S. PATENT DOCUMENTS

2006/0134893 A1* 6/2006 Savage ................... H10P 72/74 257/E29.022
2011/0266640 A1 11/2011 Kasai et al.
2017/0288087 A1* 10/2017 Schubert .......... H10H 20/01335
2018/0090657 A1 3/2018 Fei et al.
2020/0313034 A1* 10/2020 Sundgren ............. H10H 20/018
2021/0013363 A1* 1/2021 Strobl ................. H10F 71/1274
2021/0259114 A1* 8/2021 Gomez ................. G03F 7/0002
2021/0300098 A1* 9/2021 Moore ..................... B41K 3/04
2021/0311256 A1* 10/2021 Yu .......................... G02B 6/136
2022/0005774 A1* 1/2022 Chaji ................ H10H 20/8312
(Continued)

FOREIGN PATENT DOCUMENTS

JP 2009-152387 A 7/2009

OTHER PUBLICATIONS

Taiwanese Office Action dated Mar. 18, 2025, in the counterpart Taiwanese Patent Application No. 113101533.

*Primary Examiner* — Victor A Mandala
(74) *Attorney, Agent, or Firm* — Rabin & Berdo, P.C.

(57) ABSTRACT

A manufacturing method of an electronic structure includes forming a second sacrificial layer extending from a substrate to a function part of a layered substrate including the substrate, a first sacrificial layer formed on the substrate, and the function part formed on the first sacrificial layer. The manufacturing method further includes forming a cover layer extending from the substrate to the second sacrificial layer, and removing the first sacrificial layer and the second sacrificial layer.

12 Claims, 26 Drawing Sheets

(56) References Cited

U.S. PATENT DOCUMENTS

| | | | | |
|---|---|---|---|---|
| 2023/0075038 | A1 * | 3/2023 | Whiteman | H10H 20/01 |
| 2023/0096459 | A1 * | 3/2023 | Whiteman | H10H 29/142<br>257/89 |
| 2024/0071801 | A1 * | 2/2024 | Bower | H10P 72/74 |

* cited by examiner

ELECTRONIC STRUCTURE, MANUFACTURING METHOD OF ELECTRONIC STRUCTURE, AND MANUFACTURING METHOD OF ELECTRONIC DEVICE

BACKGROUND OF THE INVENTION

1. Field of the Invention

The present disclosure relates to an electronic structure, a manufacturing method of the electronic structure, and a manufacturing method of an electronic device.

2. Description of the Related Art

There has been known a technology of forming a function part on a substrate via a support layer, peeling off the function part from the substrate, and transferring the function part onto another substrate (referred to also as a transfer substrate) (see Patent Reference 1, for example).

Patent Reference 1: Japanese Patent Application Publication No. 2009-152387 (see Abstract)

In the aforementioned conventional technology, the support layer is also peeled off from the substrate and transferred onto the transfer substrate together with the function part. Therefore, work of removing the support layer is necessary in the transfer step or a subsequent step. Further, since a part of the support layer is broken at the time of the peeling, there is a possibility that a broken piece adheres to the transfer substrate and causes a defect such as a defective joint. Therefore, it is requested to facilitate the process including the transfer of the function part.

SUMMARY OF THE INVENTION

The object of the present disclosure is to facilitate the process including the transfer of the function part.

A manufacturing method of an electronic structure in the present disclosure includes a step of forming a second sacrificial layer extending from a substrate to a function part of a layered substrate including the substrate, a first sacrificial layer formed on the substrate, and the function part formed on the first sacrificial layer; a step of forming a cover layer extending from the substrate to the second sacrificial layer; and a step of removing the first sacrificial layer and the second sacrificial layer.

An electronic structure in the present disclosure includes a substrate, a function part formed on the substrate, and a cover layer formed on the substrate to surround the function part. A gap is formed between the function part and the cover layer.

A manufacturing method of an electronic device in the present disclosure includes a step of forming a second sacrificial layer extending from a substrate to a function part of a layered substrate including the substrate, a first sacrificial layer formed on the substrate, and the function part formed on the first sacrificial layer; a step of forming a cover layer extending from the substrate to the second sacrificial layer; a step of peeling off the function part from the substrate after removing the first sacrificial layer and the second sacrificial layer; and a step of transferring the function part onto another substrate different from the substrate.

According to the present disclosure, the first sacrificial layer and the second sacrificial layer are removed and the function part is held on the substrate, and thus the function part can be peeled off from the substrate with ease and transferred onto another substrate. Accordingly, the process including the transfer of the function part can be facilitated.

DETAILED DESCRIPTION OF THE INVENTION

An electronic structure and its manufacturing method according to each embodiment will be described below with reference to the drawings. The electronic structure is used in a manufacturing process of an electronic device.

The electronic device is, for example, a photoelectric conversion device or the like including a photoelectric conversion element (light-emitting element, light-receiving element) such as an LED (Light-Emitting Diode). The photoelectric conversion device is used for a photoelectric conversion module such as an LED display or an image sensor.

Further, the electronic device may also be a piezoelectric device. The piezoelectric device is used for, for example, a piezoelectric module such as a piezoelectric sensor, an actuator, an ultrasonic sensor, an ultrasonic generator or a pressure transducer. Furthermore, the electronic device may also be a switching element, a power device or the like.

First Embodiment

<Manufacturing Method of Electronic Structure>

Figure 1:
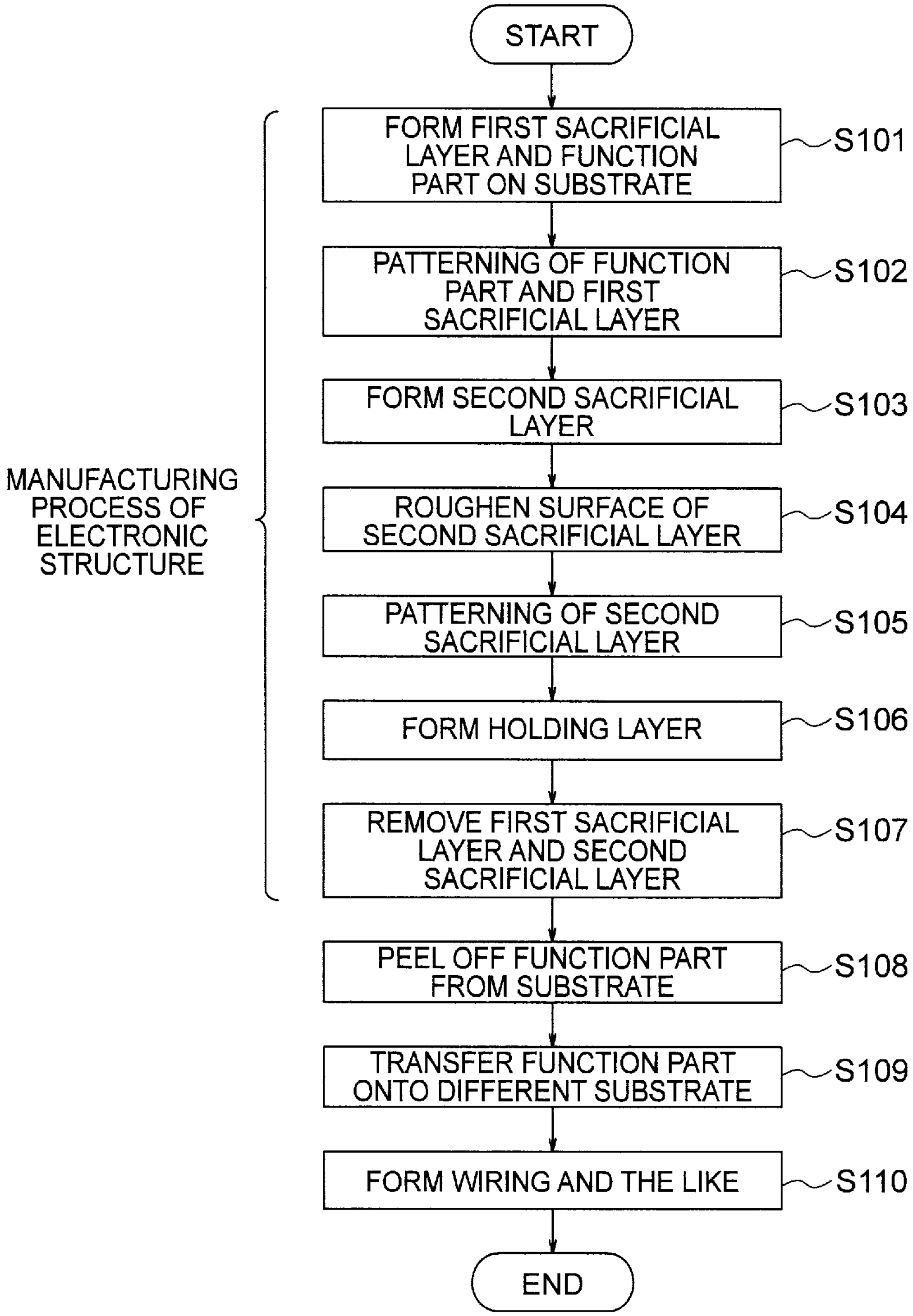
FIG. 1 is a flowchart showing a manufacturing method of an electronic structure in a first embodiment.
Figure 2A:
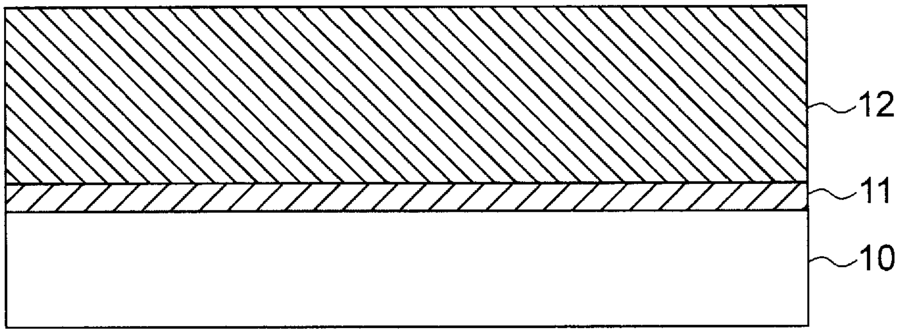
FIG. 2(A) is a cross-sectional view showing a step of forming a first sacrificial layer and a function part on a substrate in the manufacturing method of the electronic structure in the first embodiment.
Figure 2B:
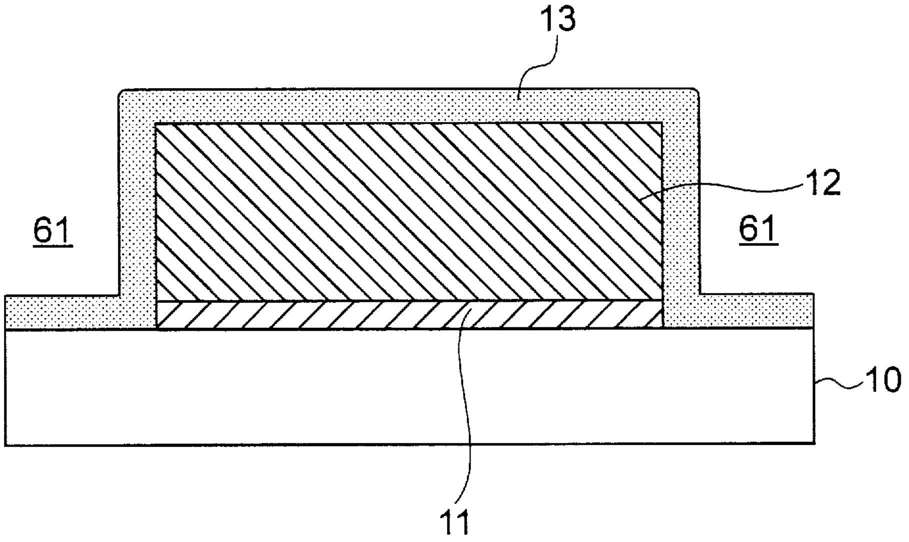
FIG. 2(B) is a cross-sectional view showing a step of forming a second sacrificial layer in the manufacturing method of the electronic structure in the first embodiment.

FIG. 1 is a flowchart showing a manufacturing method of an electronic structure in a first embodiment. FIG. 2(A) is a cross-sectional view showing a step of forming a first sacrificial layer 11 and a function part 12 on a substrate 10. FIG. 2(B) is a cross-sectional view showing a step of forming a second sacrificial layer 13.

In step S101 (FIG. 1), as shown in FIG. 2(A), the first sacrificial layer 11 is formed on the substrate 10, and the function part 12 is formed on the first sacrificial layer 11.

The substrate 10 is a semiconductor substrate or an insulative substrate. In cases where the function part 12 which will be described below is a semiconductor layer to be formed into a light-emitting element, the substrate 10 is desired to be a GaAs substrate (wafer) suitable for the formation of the semiconductor layer.

The first sacrificial layer 11 is formed on a surface (upper surface) of the substrate 10. In cases where the function part 12 is grown epitaxially on the first sacrificial layer 11, the first sacrificial layer 11 is desired to be an AlGaAs layer whose lattice constant is close to that of the function part 12 and whose etching selectivity is high. The thickness of the first sacrificial layer 11 is thicker than or equal to 10 nm and thinner than or equal to 1 μm, for example.

The function part 12 is a semiconductor layer, for example, and is an epitaxial layer. The function part 12 is referred to also as a functional thin film.

The function part 12 is a heterojunction semiconductor film of GaP/AlInGaP, for example. The function part 12 can also be GaAs, InGaP, GaN, AlGaN or InGaN. The function part 12 can also be a crystal layer having a piezoelectric property.

The function part 12 is formed by epitaxial growth on the first sacrificial layer 11 as mentioned earlier. However, it is also possible to epitaxially grow the function part 12 on a substrate different from the substrate 10, peel off the function part 12 from the substrate, and transfer the function part 12 onto the first sacrificial layer 11. In this case, the first sacrificial layer 11 can be formed of an inorganic film such as $Al_2O_3$, $SiO_2$ or the like formed by CVD (Chemical Vapor Deposition) or an organic film such as a photoresist or the like. The substrate 10 can be a Si substrate, for example.

A bottom surface of the function part 12, which faces the substrate 10, is a smooth surface whose surface roughness (maximum height Ry) is smaller than or equal to 10 nm.

In step S102 (FIG. 1), as shown in FIG. 2(B), separation grooves 61 exposing the surface of the substrate 10 are formed by patterning the first sacrificial layer 11 and the function part 12 by means of etching or the like. Incidentally, the substrate 10, the first sacrificial layer 11 and the function part 12 are collectively referred to as a layered substrate.

In step S103 (FIG. 1), as shown in FIG. 2(B), the second sacrificial layer 13 extending from the surface of the substrate 10 to the function part 12 is formed. The second sacrificial layer 13 is, for example, an inorganic film such as $Al_2O_3$, $SiO_2$ or the like or an organic film such as a photoresist or the like. The thickness of the second sacrificial layer 13 is 100 nm, for example.

If the materials of the first sacrificial layer 11 and the second sacrificial layer 13 are selected so as to be removed by the same etching solution, the first sacrificial layer 11 and the second sacrificial layer 13 can be removed at the same time in step S107 which will be described later.

The second sacrificial layer 13 is formed from the surface of the substrate 10, which is exposed via the separation grooves 61, and reaches a surface of the function part 12 (i.e., surface of the function part 12 on a side opposite to the substrate 10).

Figure 3A:
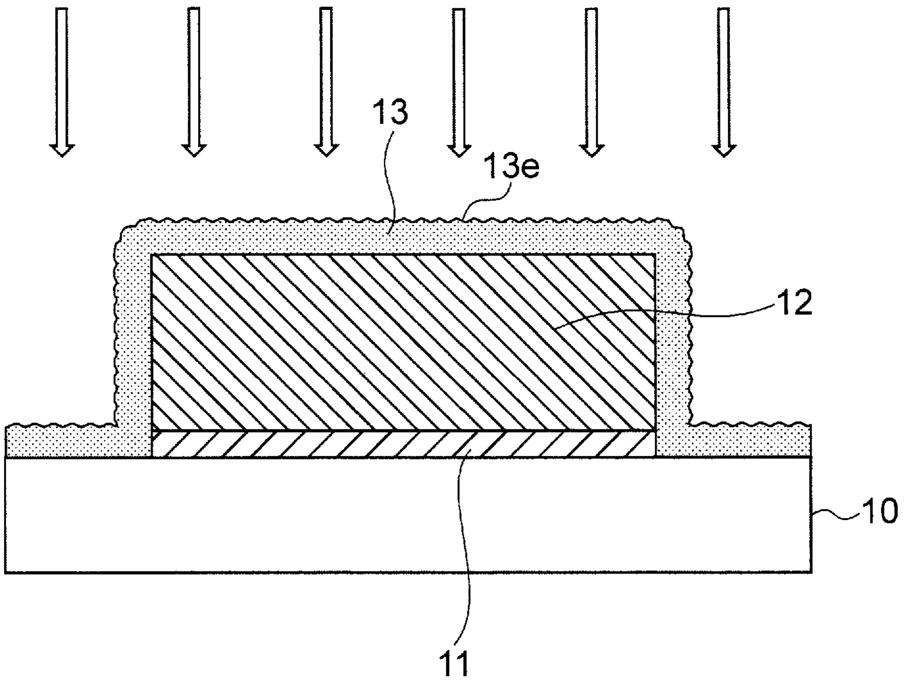
FIG. 3(A) is a cross-sectional view showing a step of roughening a surface of the second sacrificial layer in the manufacturing method of the electronic structure in the first embodiment.
Figure 3B:
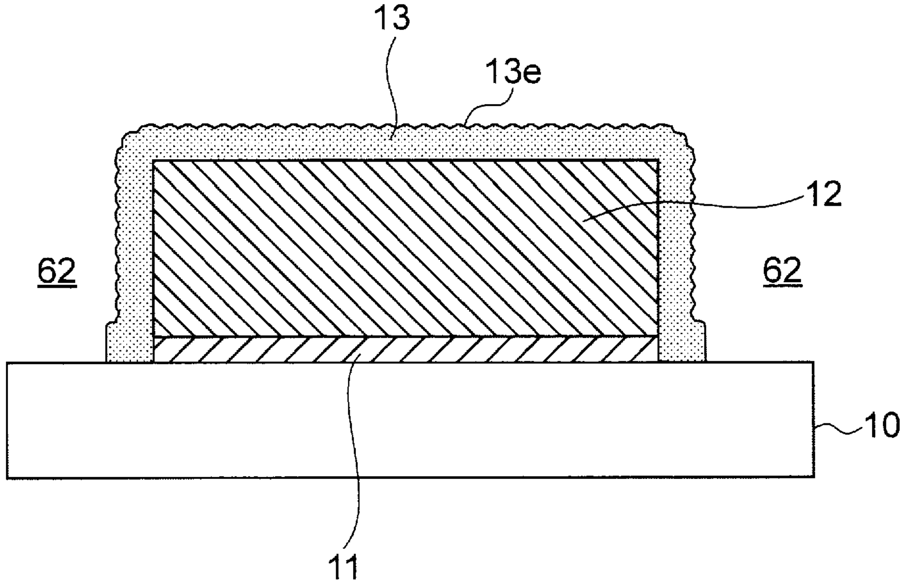
FIG. 3(B) is a cross-sectional view showing a step of patterning the second sacrificial layer in the manufacturing method of the electronic structure in the first embodiment.

FIG. 3(A) is a cross-sectional view showing a step of roughening a surface (upper surface) 13*e* of the second sacrificial layer 13. FIG. 3(B) is a cross-sectional view showing a step of patterning the second sacrificial layer 13.

In step S104 (FIG. 1), as shown in FIG. 3(A), the surface 13*e* of the second sacrificial layer 13 is roughened. The roughening is processing for increasing the surface roughness, and is executed by means of plasma processing such as ashing, for example.

The roughening is not limited to plasma processing but may also be executed by making particles adhere to the surface 13*e* of the second sacrificial layer 13. For example, by means of vacuum evaporation of a metallic material, the metallic material granularized by self-organization adheres to the surface 13*e* of the second sacrificial layer 13 and the surface roughness can be increased. Irrespective of which roughening method is used, side faces of the second sacrificial layer 13 are also roughened in addition to the surface 13*e* of the second sacrificial layer 13.

The surface roughness of the surface 13*e* of the second sacrificial layer 13 after the roughening is rougher than the surface roughness of a bottom surface of the function part 12 (i.e., surface of the function part 12 on the substrate 10 side). As an example, the surface roughness (maximum height Ry) of the surface 13*e* of the second sacrificial layer 13 is rougher than 10 nm.

In step S105 (FIG. 1), as shown in FIG. 3(B), openings 62 are formed by patterning the second sacrificial layer 13. The openings 62 are formed in order to facilitate the etching solution to reach the first sacrificial layer 11 in a step of removing the sacrificial layers 11 and 13 (step S107) which will be described later.

Figure 4A:
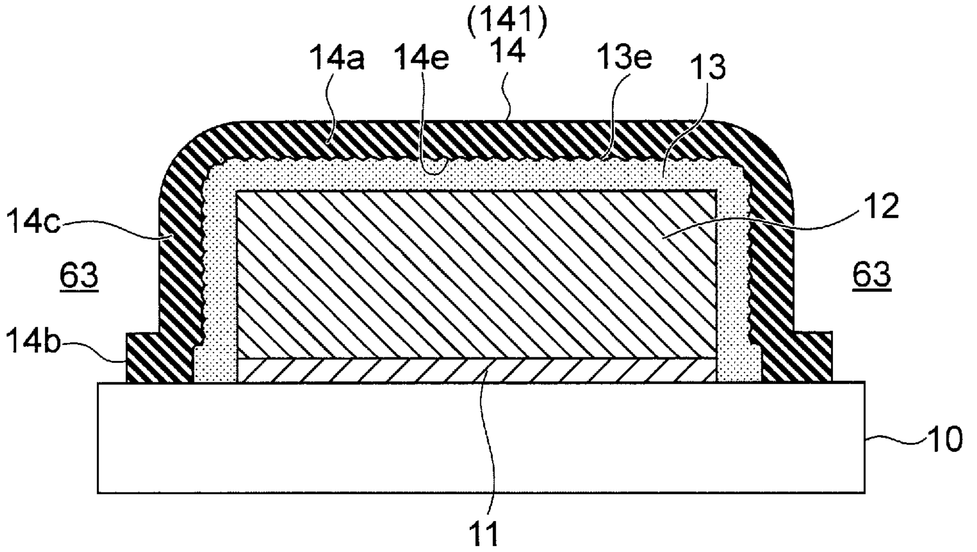
FIGS. 4(A) and 4(B) are a cross-sectional view and a plan view showing a step of forming a holding layer (cover layer) in the manufacturing method of the electronic structure in the first embodiment.
Figure 4B:
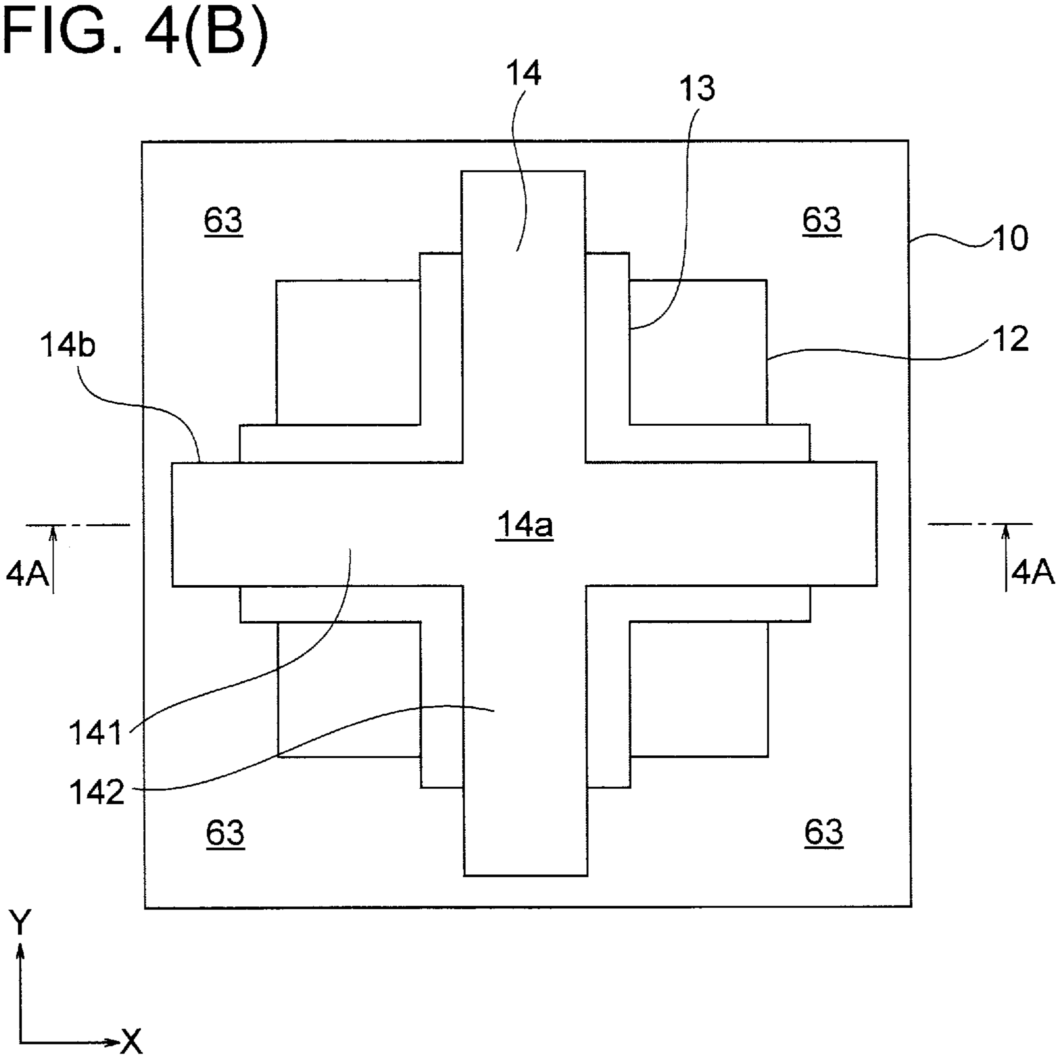

FIGS. 4(A) and 4(B) are a cross-sectional view and a plan view showing a step of forming a holding layer 14. Incidentally, FIG. 4(A) corresponds to a cross-sectional view taken along the line 4A-4A shown in FIG. 4(B).

In step S106 (FIG. 1), as shown in FIG. 4(A), the holding layer 14 as a cover layer extending from the surface of the substrate 10 to the second sacrificial layer 13 is formed. The material of the holding layer 14 is desired to be a material that is not eroded by the etching solution in the step of removing the first sacrificial layer 11 and the second sacrificial layer 13 (step S107) which will be described later. As an example, an organic resist is used as the material of the holding layer 14.

A surface 14*e* of the holding layer 14 in contact with the surface 13*e* of the second sacrificial layer 13 is roughened similarly to the surface 13*e* of the second sacrificial layer 13. The surface roughness of the surface 14*e* of the holding layer 14 is rougher than the surface roughness of the bottom surface of the function part 12 (i.e., surface of the function part 12 on the substrate 10 side), for example. As an example, the surface roughness (maximum height Ry) of the surface 14*e* of the holding layer 14 is rougher than 10 nm.

As shown in FIG. 4(A), the holding layer 14 includes a top part 14*a* formed on the surface of the second sacrificial layer 13, a base part 14*b* formed on the surface of the substrate 10, and a pillar part 14*c* extending between the top part 14*a* and the base part 14*b*.

Further, the holding layer 14 is desirably patterned as shown in FIG. 4(B). Here, along the surface of the substrate 10, an X direction and a Y direction orthogonal to each other are defined. A planer shape of the function part 12 is a rectangular shape having two sides extending in the X direction and two sides extending in the Y direction.

In a top view, the holding layer 14 includes a first extension part 141 straddling the function part 12 in the X direction and a second extension part 142 straddling the function part 12 in the Y direction. The first extension part 141 and the second extension part 142 intersect with each other at the center of the surface of the function part 12.

Since the holding layer 14 is patterned as above, openings 63 are formed at positions corresponding to four corners of the function part 12. Incidentally, the openings 62 of the second sacrificial layer 13 formed in the above-described step S105 are formed at positions corresponding to the openings 63.

Figure 5A:
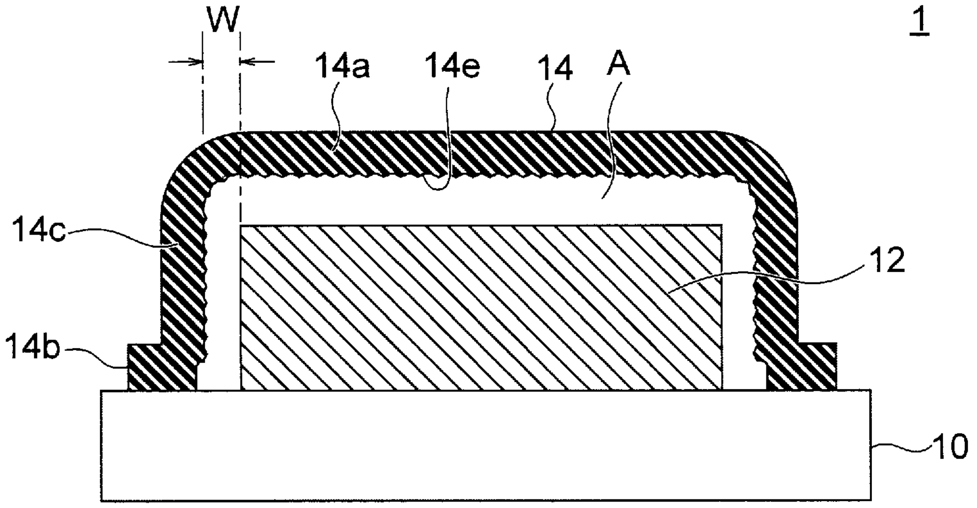
FIGS. 5(A) and 5(B) are a cross-sectional view and a bottom view showing a step of removing the first sacrificial layer and the second sacrificial layer in the manufacturing method of the electronic structure in the first embodiment.
Figure 5B:
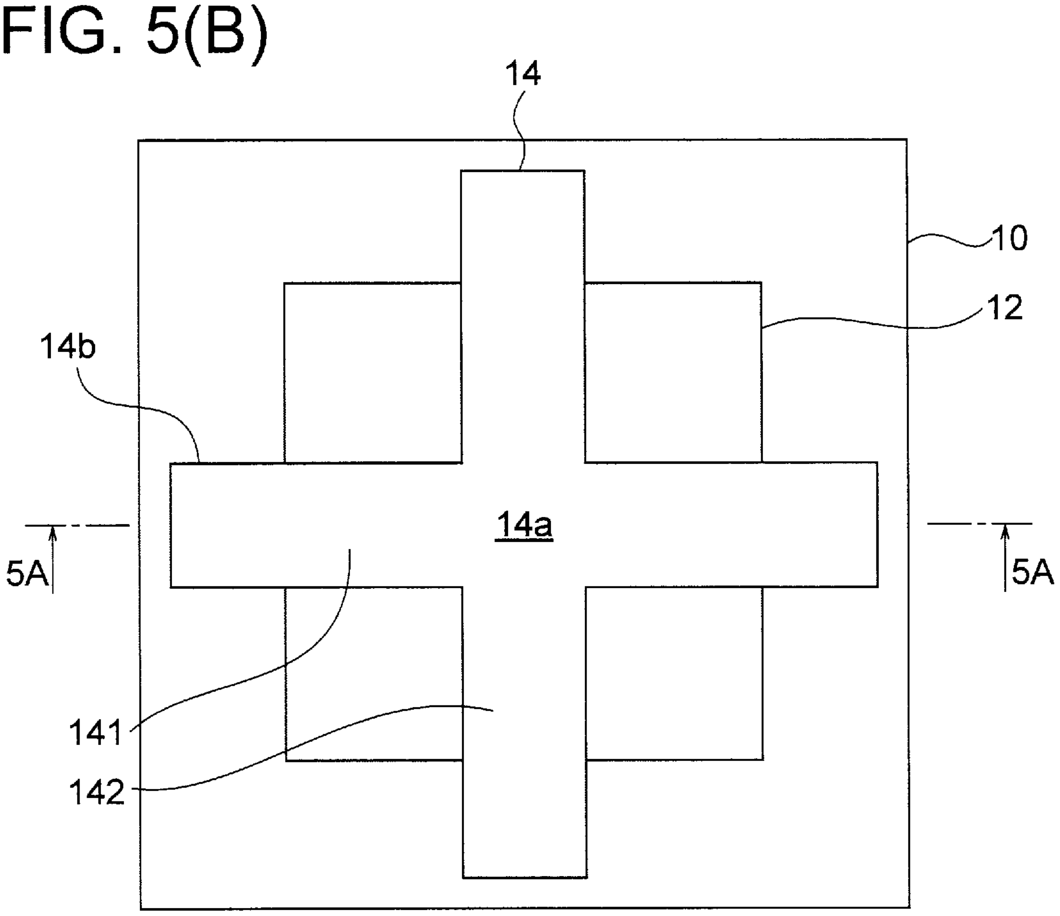

FIGS. 5(A) and 5(B) are a cross-sectional view and a plan view showing the step of removing the first sacrificial layer 11 and the second sacrificial layer 13. Incidentally, FIG. 5(A) corresponds to a cross-sectional view taken along the line 5A-5A shown in FIG. 5(B).

In step S107 (FIG. 1), as shown in FIG. 5(A), the first sacrificial layer 11 and the second sacrificial layer 13 are removed by means of wet etching. As the etching solution, a liquid mixture of phosphoric acid and hydrogen peroxide can be used, for example.

Due to the removal of the first sacrificial layer 11 and the second sacrificial layer 13, the function part 12 is suspended in the etching solution. In this case, displacement of the function part 12 is inhibited since the function part 12 is surrounded by the holding layer 14.

Especially, since the holding layer 14 is provided so as to straddle the function part 12 in the X direction and in the Y direction, the displacement of the function part 12 in a plane parallel to the surface of the substrate 10 is prevented and the position of the function part 12 in a direction orthogonal to the surface of the substrate 10 is also restricted.

Incidentally, regarding the removal of each sacrificial layer, it is sufficient that most of the sacrificial layer is removed. That is, it is permissible even if a small part of the sacrificial layer is left unremoved. For example, it is permissible even if a small part of the first sacrificial layer 11 remains on the substrate 10 (see FIG. 10 which will be explained later).

After the substrate 10 is taken out of the etching solution, the function part 12, due to its own weight, adheres to the surface of the substrate 10 and is held on the surface of the substrate 10. The adhesion force between the function part 12 and the surface of the substrate 10 is force due to the wight of the function part 12, and thus is weak adhesion force. Further, a gap A is formed between the function part 12 and the holding layer 14.

A gap W between a side face of the function part 12 and the holding layer 14 corresponds to the thickness of the second sacrificial layer 13. As the thickness of the second sacrificial layer 13 decreases, the gap W can be decreased and the displacement of the function part 12 while being suspended in the etching solution can be inhibited further. Namely, positional accuracy of the function part 12 on the substrate 10 can be increased.

While the thickness of the second sacrificial layer 13 is 100 nm in this example, the thickness of the second sacrificial layer 13 is not limited to 100 nm. The thickness of the second sacrificial layer 13 is desired to be thinner than or equal to 1 μm since the positional accuracy of the function part 12 on a transfer substrate 20 which will be described later (FIG. 8(A)) is required on the order of 1 μm.

Incidentally, while the first sacrificial layer 11 and the second sacrificial layer 13 are removed at the same time in the step S107, it is permissible even if one of the sacrificial layers 11 and 13 is removed first. In this case, the materials of the first sacrificial layer 11 and the second sacrificial layer 13 are selected so as to be respectively removed by different etching solutions.

For example, when the first sacrificial layer 11 is removed prior to the second sacrificial layer 13, during the removal of the first sacrificial layer 11, the function part 12 is held at a position apart from the substrate 10 by the second sacrificial layer 13. Therefore, hanging down of a peripheral part of the function part 12 can be prevented and it is possible to let the etching solution spread over the first sacrificial layer 11. Accordingly, insufficient etching can be eliminated and the first sacrificial layer 11 can be removed efficiently.

By removing the first sacrificial layer 11 and the second sacrificial layer 13 as described above, an electronic structure 1 including the substrate 10, the function part 12 and the holding layer 14 and having the gap A between the function part 12 and the holding layer 14 is obtained as shown in FIG. 5(A). The steps S101 to S107 correspond to a manufacturing process of the electronic structure 1.

By these steps S101 to S107 and steps S108 to S110 which will be described below, an electronic device 2 is manufactured.

Figure 6A:
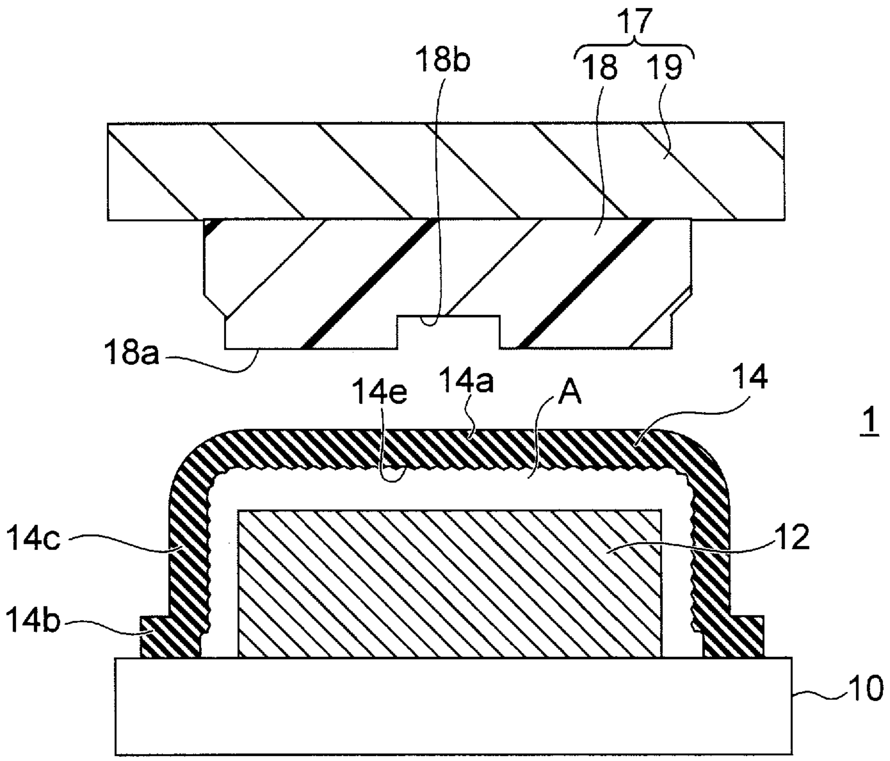
FIGS. 6(A) and 6(B) are a cross-sectional view and a plan view showing the electronic structure and a transfer tool in the first embodiment.
Figure 6B:
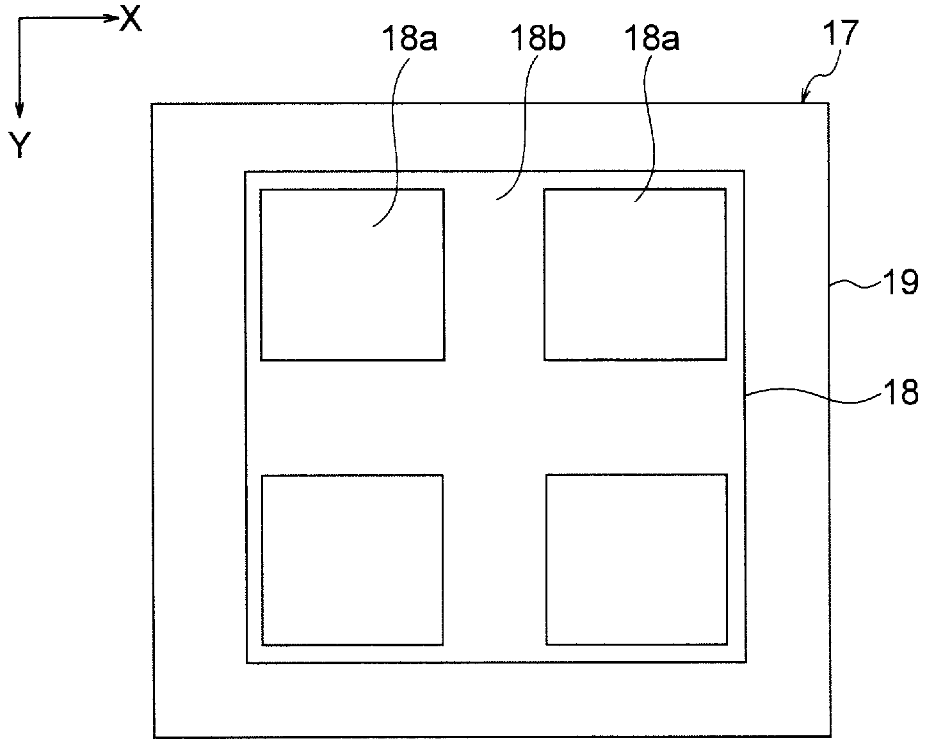

FIG. 6(A) is a cross-sectional view showing the electronic structure 1 and a transfer tool 17. FIG. 6(B) is a bottom view showing the transfer tool 17.

In step S108 (FIG. 1), the function part 12 and the holding layer 14 are peeled off from the substrate 10 of the electronic structure 1. The transfer tool 17 shown in FIG. 6(A) is used for the peeling. The transfer tool 17 includes a holding body 18 and a support substrate 19 that supports the holding body 18.

The holding body 18, which is desired to have adhesiveness (tackiness) and elasticity, is an organic structure in this example. For example, the holding body 18 can be formed of an elastomer or a thick-film resist on a surface of the support substrate 19 formed of a hard material. The holding body 18 includes first contact parts 18*a* that make contact with the surface of the function part 12 and a second contact part 18*b* that makes contact with a surface of the holding layer 14 (i.e., a surface of the top part 14*a*). The first contact parts 18*a* are at a position projected toward the electronic structure 1 with respect to the second contact part 18*b*.

In the case where the holding layer 14 extends in the X direction and the Y direction and in a cross shape (see FIG. 5(B)), the first contact parts 18*a* are arranged in two rows and two columns in the X direction and the Y direction. The second contact part 18*b* is formed as a groove extending in a cross shape like the holding layer 14.

Figure 7A:
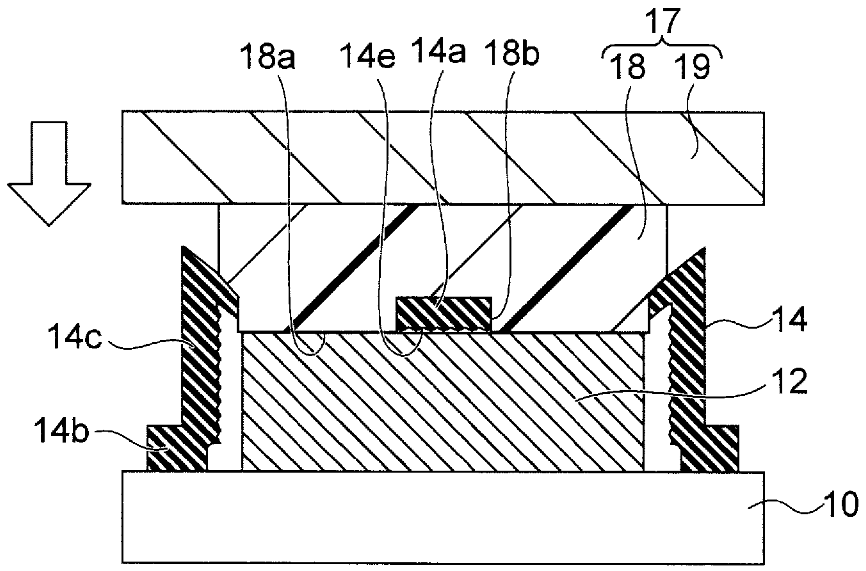
FIGS. 7(A) and 7(B) are cross-sectional views showing stepwise a step of peeling off the function part of the structure from the substrate in the first electronic embodiment.
Figure 7B:
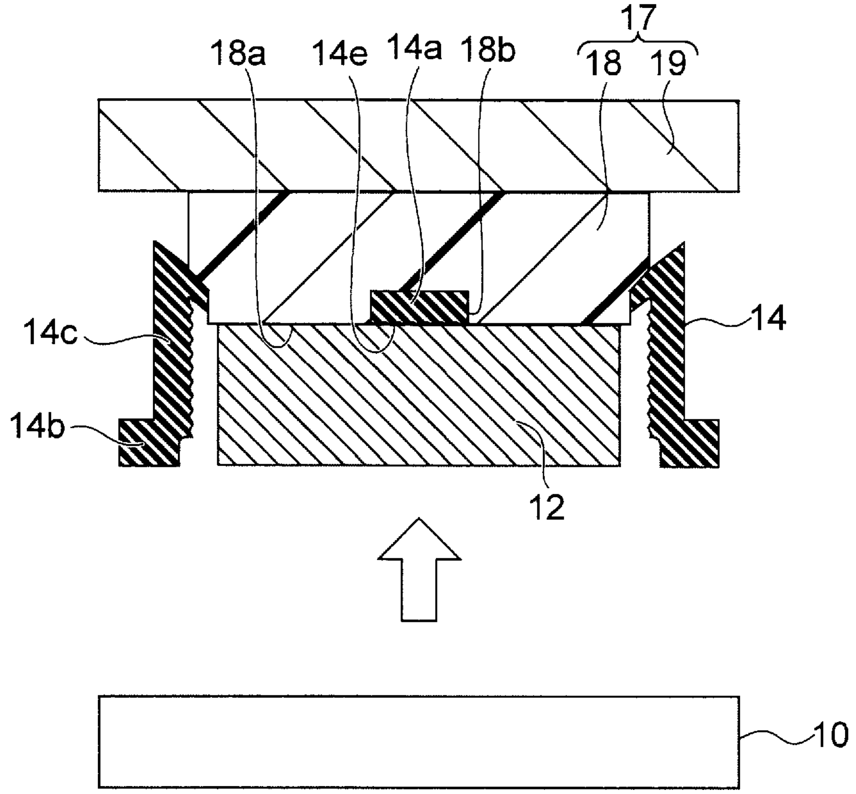

FIGS. 7(A) and 7(B) are cross-sectional views showing stepwise a step of peeling off the function part 12 and the holding layer 14 from the substrate 10.

First, as shown in FIG. 7(A), the contact parts 18*a* and 18*b* of the holding body 18 of the transfer tool 17 are pressed against the function part 12 and the holding layer 14. The holding layer 14 is deformed by being pressed by the holding body 18 from above and makes contact with the surface of the function part 12. However, the adhesion force between the holding layer 14 and the function part 12 is extremely weak since the surface 14*e* of the holding layer 14 on the function part 12 side has been roughened.

Subsequently, as shown in FIG. 7(B), the transfer tool 17 is moved in a direction away from the substrate 10. The function part 12 is peeled off from the substrate 10 together with the holding layer 14 since the adhesion force between the holding body 18 of the transfer tool 17 and the function part 12 is stronger than the adhesion force between the function part 12 and the surface of the substrate 10.

Figure 8A:
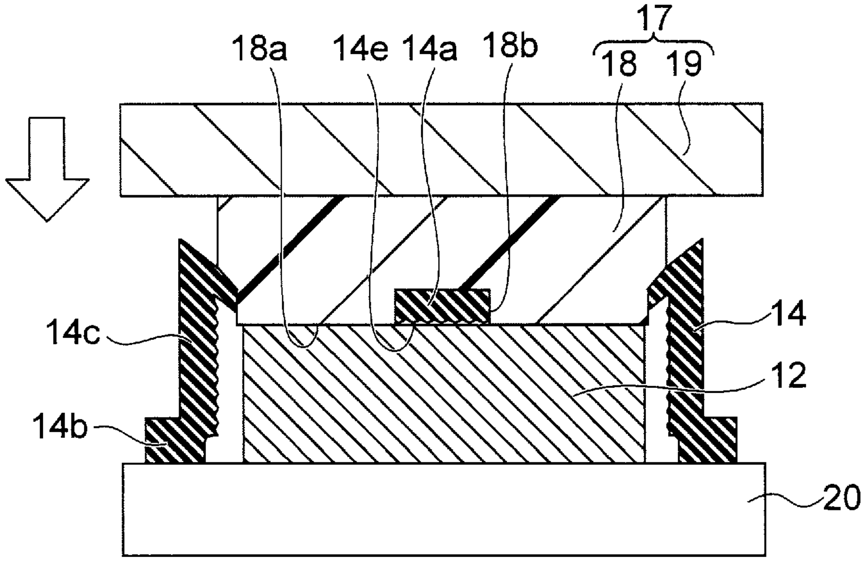
FIGS. 8(A) and 8(B) are cross-sectional views showing stepwise a step of transferring the function part of the electronic structure onto a transfer substrate in the first embodiment
Figure 8B:
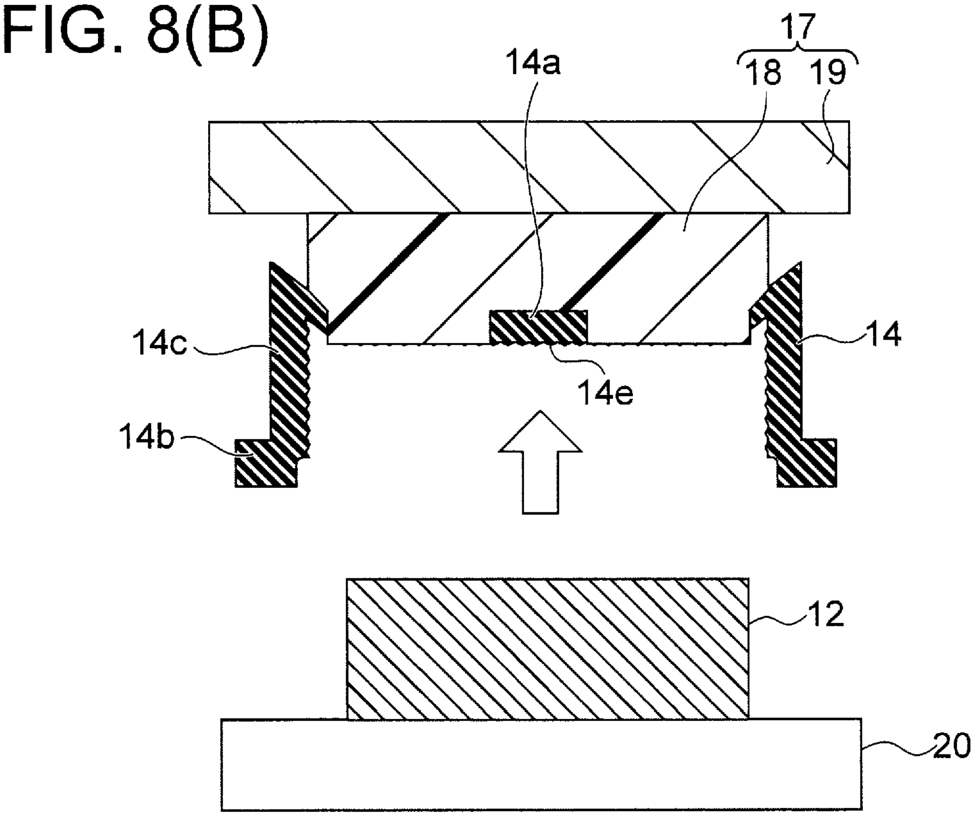

FIGS. 8(A) and 8(B) are cross-sectional views showing stepwise a step of transferring the function part 12 and the holding layer 14 onto a substrate (referred to as a transfer substrate) different from the substrate 10. The transfer substrate 20 has a smooth surface in a mounting region for the function part 12, and the surface roughness (maximum height Ry) of the smooth surface is smaller than or equal to 10 nm. The transfer substrate 20 is referred to also as a second substrate.

In step S109 (FIG. 1), as shown in FIG. 8(A), the transfer tool 17 is moved to a position above the transfer substrate 20, and the function part 12 held by the transfer tool 17 is pressed against the surface of the transfer substrate 20.

The bottom surface of the function part 12 and the surface of the transfer substrate 20 are both smooth surfaces with surface roughness smaller than or equal to 10 nm. Thus, by performing predetermined pressing and heating, the bottom surface of the function part 12 and the surface of the transfer substrate 20 are joined together by intermolecular force, that is, strong joining force.

Thereafter, as shown in FIG. 8(B), the transfer tool 17 is moved in a direction away from the transfer substrate 20.

The joining force between the bottom surface of the function part 12 and the surface of the transfer substrate 20 is stronger than the adhesion force between the holding body 18 of the transfer tool 17 and the function part 12 and the holding layer 14. Further, the adhesion force between the holding layer 14 and the function part 12 is extremely weak since the surface 14*e* of the holding layer 14 on the function part 12 side has been roughened.

Accordingly, the function part 12 remains being joined to the transfer substrate 20, and the holding layer 14 separates from the transfer substrate 20 together with the transfer tool 17. Since only the function part 12 remains on the transfer substrate 20, it s unnecessary to remove unnecessary members from the surface of the transfer substrate 20.

Figure 9A:
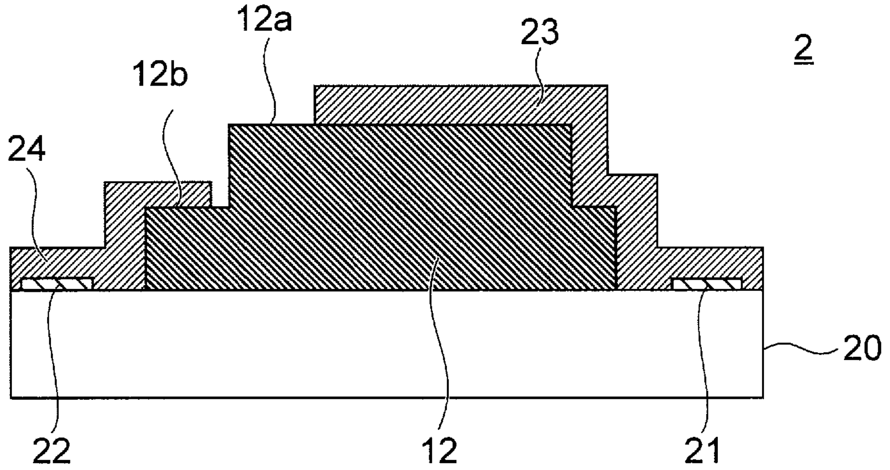
FIGS. 9(A) and 9(B) are a cross-sectional view and a plan view showing a step of forming wiring and the like on the function part transferred from the electronic structure onto the transfer substrate in the first embodiment.
Figure 9B:
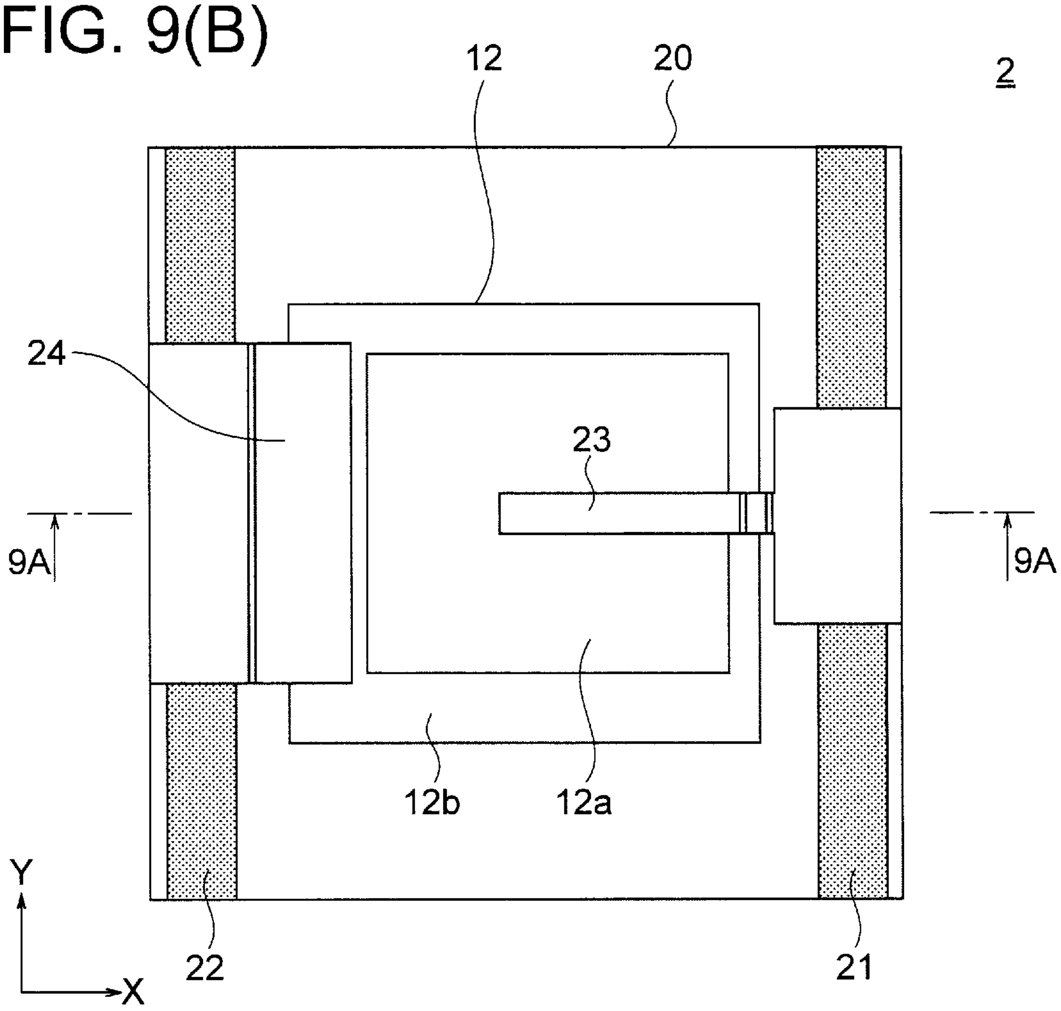

FIGS. 9(A) and 9(B) are a cross-sectional view and a plan view showing a step of forming wiring and the like on the function part 12 transferred onto the transfer substrate 20. Incidentally, FIG. 9(A) corresponds to a cross-sectional view taken along the line 9A-9A shown in FIG. 9(B).

In step S110 (FIG. 1), as shown in FIGS. 9(A) and 9(B), the wiring and the like are formed on the function part 12. The function part 12 is made into an LED, for example, by forming the mesa structure by means of patterning and forming the wiring and the like.

For example, by a semiconductor process, wiring layers 23 and 24 are formed so as to connect an anode layer 12*a* and a cathode layer 12*b* of the function part 12 to wirings 21 and 22 on the transfer substrate 20. Besides the semiconductor process, it is also possible to use wire bonding or a printing process, for example.

With these steps, the electronic device 2 is completed. When voltage from a drive circuit is applied to the wiring layers 23 and 24 via the wirings 21 and 22, light is emitted from the function part 12 as an LED.

<Function>

The electronic structure 1 in this first embodiment is manufactured by forming the first sacrificial layer 11, the function part 12, the second sacrificial layer 13 and the holding layer 14 on the substrate 10 and thereafter removing the first sacrificial layer 11 and the second sacrificial layer 13 as shown in FIG. 5(A). Accordingly, the function part 12 adheres to the surface of the substrate 10 with weak force and is held on the surface of the substrate 10.

Therefore, the function part 12 can be peeled off from the substrate 10 with ease as shown in FIG. 7(B) and transferred onto the transfer substrate 20. Accordingly, the process including the transfer of the function part 12 can be facilitated.

Further, after the transfer of the function part 12 onto the transfer substrate 20, the holding layer 14 is removed while remaining adhering to the transfer tool 17 as shown in FIG. 8(B), and thus a step of removing the holding layer 14 from the transfer substrate 20 is unnecessary. Therefore, a printed circuit board, a flexible circuit board or the like on which electronic components and the like have previously been mounted can be used as the transfer substrate 20.

Furthermore, since the holding layer 14 extends from the substrate 10 to the second sacrificial layer 13 as shown in FIG. 4(A), the displacement of the function part 12 can be inhibited by the holding layer 14 in the step of removing the first sacrificial layer 11 and the second sacrificial layer 13. Therefore, the positional accuracy of the function part 12 on the substrate 10 can be enhanced.

Moreover, by roughening the surface 13*e* of the second sacrificial layer 13 as shown in FIG. 3(A), the surface 14*e* on the function part 12 side of the holding layer 14 formed on the second sacrificial layer 13 is also roughened. Thus, the adhesion force between the function part 12 and the holding layer 14 can be weakened and the holding layer 14 can be separated from the function part 12 with ease in the step shown in FIG. 8(B).

Effect of First Embodiment

As described above, the manufacturing method of the electronic structure 1 in the first embodiment includes the step of forming the second sacrificial layer 13 extending from the substrate 10 to the function part 12 of the layered substrate including the substrate 10, the first sacrificial layer 11 provided on the substrate 10, and the function part 12 formed on the first sacrificial layer 11; the step of forming the holding layer (cover layer) 14 extending from the substrate 10 to the second sacrificial layer 13; and the step of removing the first sacrificial layer 11 and the second sacrificial layer 13.

In this electronic structure 1, the function part 12 is held in the state of adhering to the substrate 10 with weak adhesion force, and thus the function part 12 can be peeled off from the substrate 10 with ease and transferred onto the transfer substrate 20. Accordingly, the process including the transfer of the function part 12 can be facilitated.

Further, in the step of removing the first sacrificial layer 11 and the second sacrificial layer 13, the holding layer 14 performs the function of inhibiting the displacement of the function part 12. Therefore, the positional accuracy of the function part 12 on the substrate 10 can be increased.

Furthermore, by setting the surface roughness of the surface 14*e* of the holding layer 14 on the function part 12 side to be rougher than the surface roughness of the bottom surface of the function part 12 (i.e., the surface of the function part 12 on the substrate 10 side), the holding layer 14 can be separated from the function part 12 with ease after the function part 12 is transferred onto the transfer substrate 20.

Moreover, since the first sacrificial layer 11 and the second sacrificial layer 13 are removed by using the same etching material, the first sacrificial layer 11 and the second sacrificial layer 13 can be removed by a single step (step S107) and production efficiency can be enhanced further.

Figure 10:
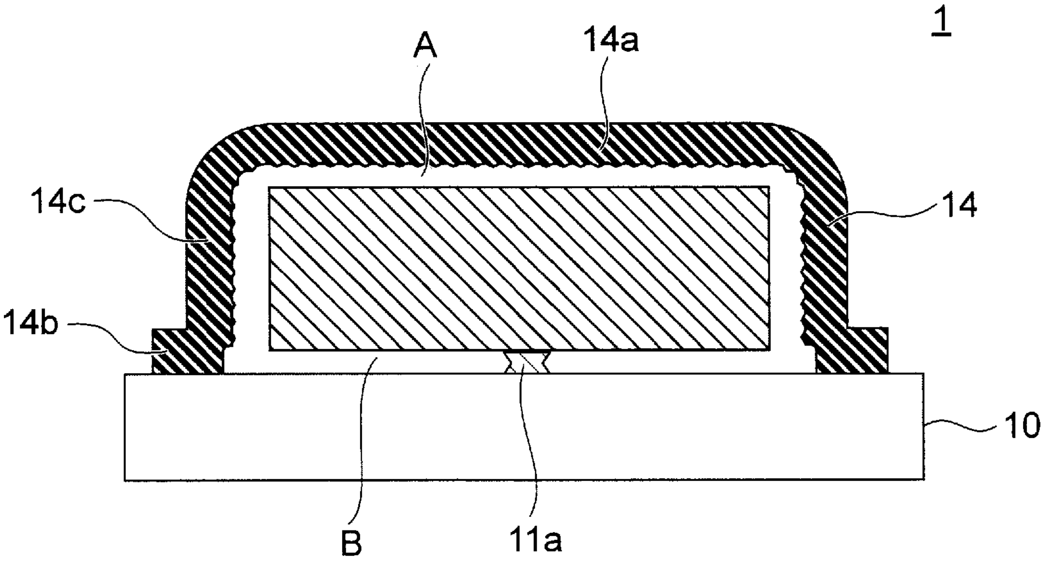
FIG. 10 is a cross-sectional view showing another configuration example of the electronic structure in the first embodiment.

FIG. 10 is a diagram showing another configuration example of the electronic structure 1. While the electronic structure 1 shown in FIG. 10 is manufactured by a manufacturing method similar to that in the first embodiment, a part (referred to as a remaining part 11*a*) of the first sacrificial layer 11 is left unremoved in the step S107 (FIG. 1).

In this configuration example, the substrate 10 and the function part 12 are joined to each other via the remaining part 11*a*, and thus the effect of inhibiting the displacement of the function part 12 on the substrate 10 is greater. Further, if the area of the remaining part 11*a* of the first sacrificial layer 11 is set at a minute area, the function part 12 can be peeled off from the substrate 10 with ease in the step S108 (FIG. 1).

In this regard, a washing step for removing the remaining part 11*a* from the bottom surface of the function part 12 is necessary before the transfer step (FIG. 8(A)) of transferring the function part 12 onto the transfer substrate 20.

Modification

Next, a modification of the first embodiment will be described below. In the modification, a function unit 30 including a plurality of elements and wiring layers is used instead of the function part 12 in the first embodiment. The function unit 30 is, for example, formed on another growth substrate, peeled off from the growth substrate, and transferred onto the substrate 10.

Figure 11A:
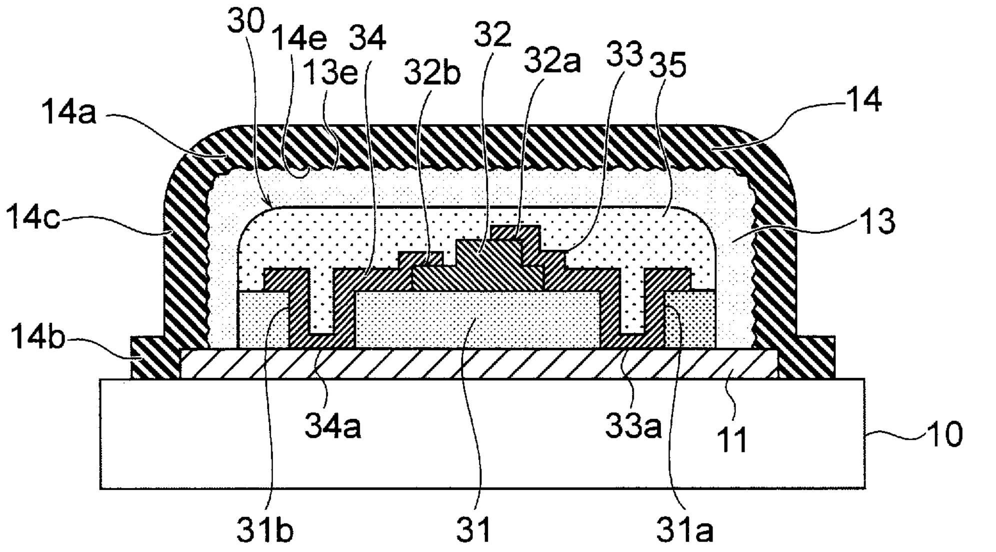
FIGS. 11(A) and 11(B) are a cross-sectional view and a plan view showing a state in which the first sacrificial layer, a function unit, the second sacrificial layer and the holding layer are formed on the substrate in a manufacturing method of an electronic structure in a modification.
Figure 11B:
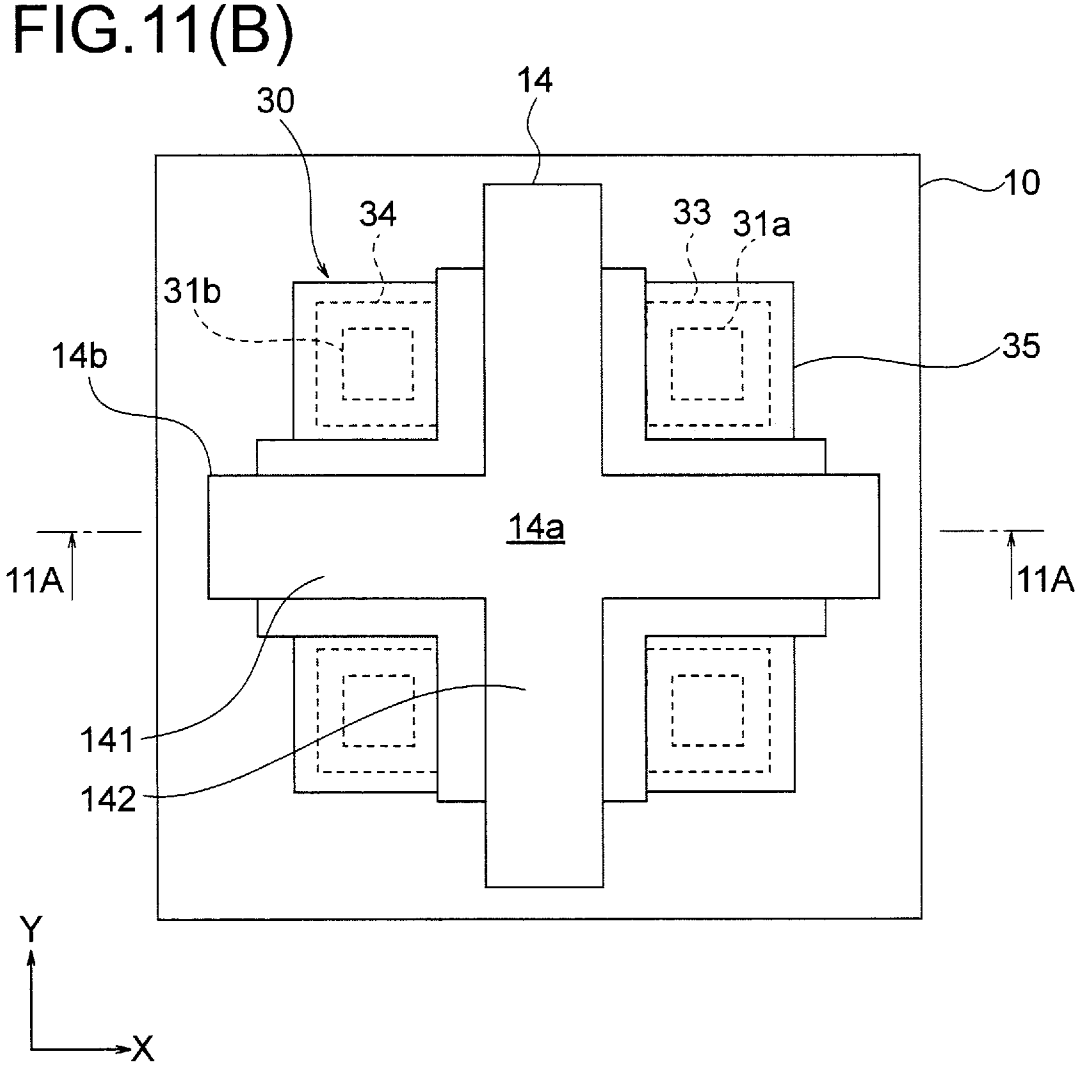

FIGS. 11(A) and 11(B) are a cross-sectional view and a plan view showing a state in which the first sacrificial layer 11, the function unit 30, the second sacrificial layer 13 and the holding layer 14 have been formed on the substrate 10 in a manufacturing method of an electronic structure 1A in the modification of the first embodiment.

The function unit 30 as a function part includes a base layer 31, a function layer 32, a first wiring layer 33, a second wiring layer 34, and a capsule layer 35 covering these layers.

The base layer 31 is formed of an insulator such as $SiO_2$, and is arranged on the first sacrificial layer 11. In the base layer 31, through holes 31*a* and 31*b* reaching the first sacrificial layer 11 are formed. The bottom surface of the base layer 31 (i.e., surface of the base layer 31 on the substrate 10 side) is a smooth surface whose surface roughness (maximum height Ry) is smaller than or equal to 10 nm.

The function layer 32 is a semiconductor layer, for example, and is an epitaxial layer. The function layer 32 includes an anode layer 32*a* and a cathode layer 32*b*. The function layer 32 is referred to also as a functional thin film.

The wiring layers 33 and 34 are formed of gold (Au) or alloy of gold, for example. The first wiring layer 33 extends from the anode layer 32*a* of the function layer 32 to the through hole 31*a* of the base layer 31. The first wiring layer 33 is exposed to a bottom surface of the base layer 31 via the through hole 31*a* and forms an electrode pad 33*a*. The surface roughness of the electrode pad 33*a* is 10 nm, for example.

The second wiring layer 34 extends from the cathode layer 32*b* of the function layer 32 to the through hole 31*b* of the base layer 31. The second wiring layer 34 is exposed to the bottom surface of the base layer 31 via the through hole 31*b* and forms an electrode pad 34*a*. The surface roughness of the electrode pad 34*a* is 10 nm, for example.

The capsule layer 35 is formed of an insulator such as $SiO_2$, and is formed to cover the base layer 31, the function layer 32 and the wiring layers 33 and 34. In cases where the function layer 32 is a semiconductor element such as an LED, the capsule layer 35 is formed of a material that transmits light.

An element having a predetermined function (for example, light-emitting function) is formed by the function layer 32, the first wiring layer 33 and the second wiring layer 34. As shown in FIG. 12(B) which will be explained later, a plurality of elements having different functions are provided in the function unit 30. In this example, three elements (each including the function layer 32 and the wiring layers 33 and 34) respectively emitting light of red color, green color and blue color are provided in the function unit 30.

The function unit 30 is provided on the first sacrificial layer 11. Further, the second sacrificial layer 13 is provided on the function unit 30, and the holding layer 14 is provided on the second sacrificial layer 13. Incidentally, the substrate 10, the first sacrificial layer 11 and the function unit 30 are collectively referred to as a layered substrate.

The first sacrificial layer 11 and the second sacrificial layer 13 are inorganic films or organic films, for example. More specifically, the first sacrificial layer 11 and the second sacrificial layer 13 are formed of a material that is removed by an etching solution not eroding the base layer 31 and the capsule layer 35 of the function unit 30.

The holding layer 14 is formed of an organic resist, for example. The holding layer 14 includes the top part 14*a*, the base part 14*b* and the pillar part 14*c* as described in the first embodiment.

As described in the first embodiment, the surface 13*e* of the second sacrificial layer 13 is roughened, and the surface 14*e* of the holding layer 14 in contact with the surface 13*e* of the second sacrificial layer 13 is also roughened.

Incidentally, while the surface 14*e* of the holding layer 14 is roughened by roughening the surface 13*e* of the second sacrificial layer 13 in this example, the surface 14*e* of the holding layer 14 may be roughened by a different method. For example, if a surface of the capsule layer 35 of the function unit 30 is roughened, the surface 13*e* of the second sacrificial layer 13 is roughened accordingly, and the surface 14*e* of the holding layer 14 can be roughened.

Figure 12A:
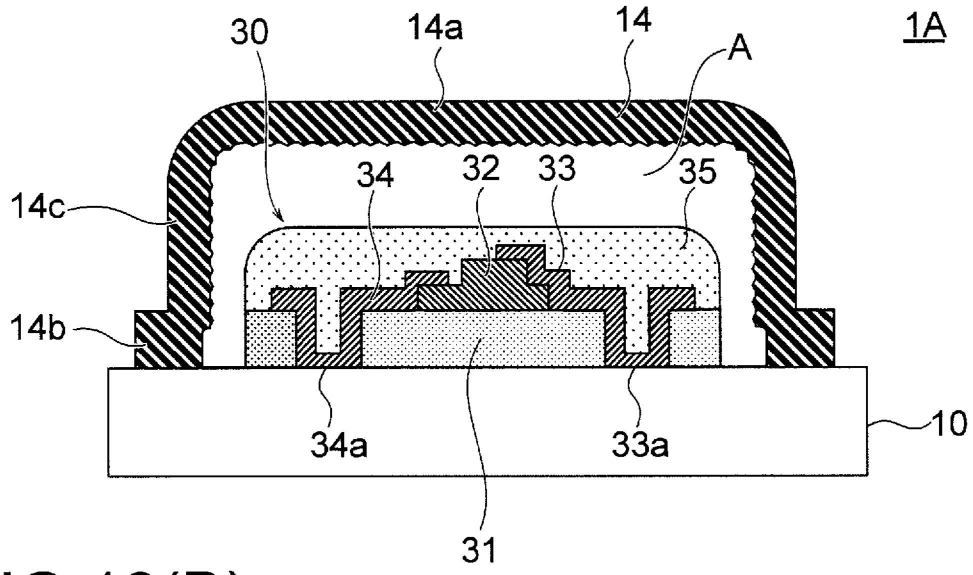
FIGS. 12(A) and 12(B) are a cross-sectional view and a plan view showing a step of removing the first sacrificial layer and the second sacrificial layer in the manufacturing method of the electronic structure in the modification.
Figure 12B:
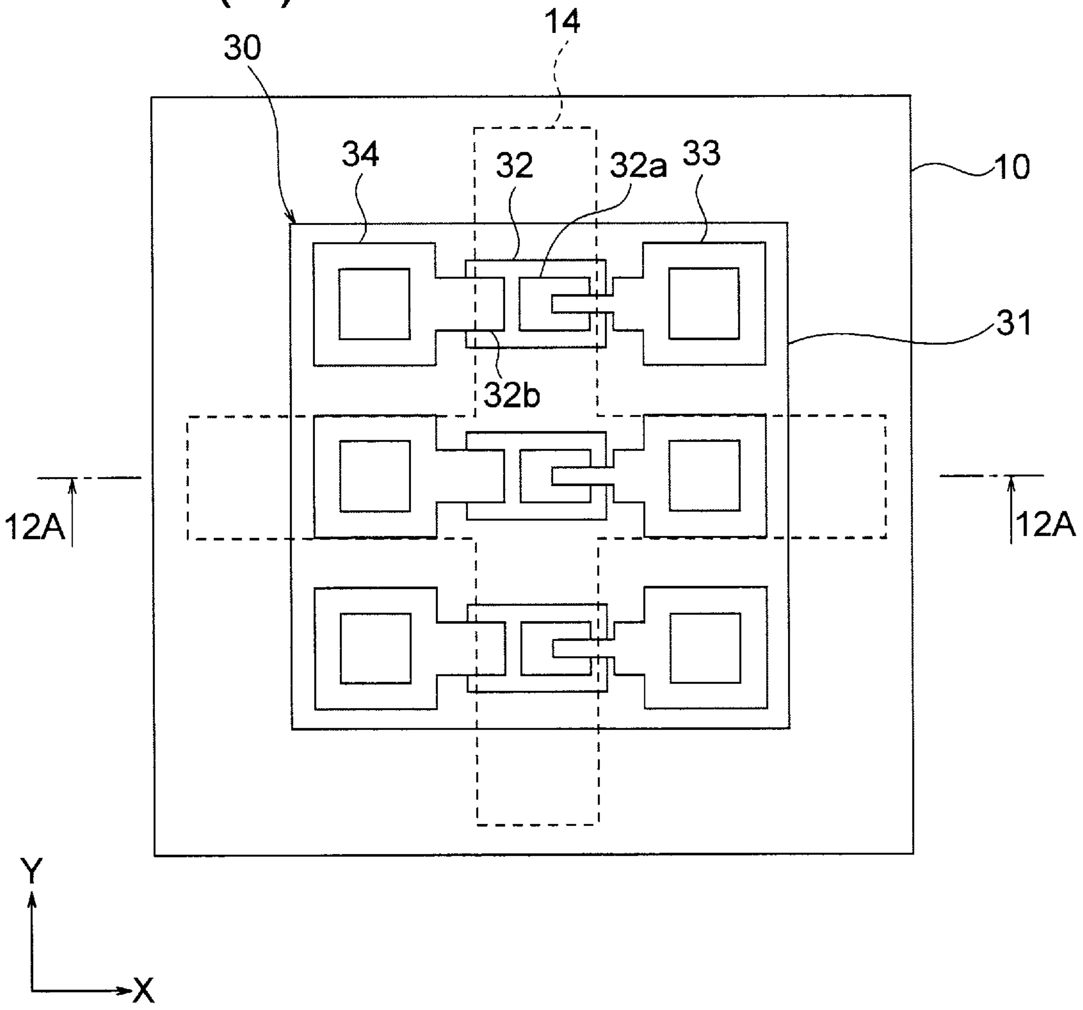

FIGS. 12(A) and 12(B) are a cross-sectional view and a plan view showing a step of removing the first sacrificial layer 11 and the second sacrificial layer 13. Incidentally, FIG. 12(A) corresponds to a cross-sectional view taken along the line 12A-12A shown in FIG. 12(B).

The removal of the first sacrificial layer 11 and the second sacrificial layer 13 is executed by means of wet etching similarly to the step S107 in the first embodiment. As the etching solution, a material not eroding the base layer 31 and the capsule layer 35 of the function unit 30 is selected.

It is possible either to remove the first sacrificial layer 11 and the second sacrificial layer 13 in the same step or to remove the first sacrificial layer 11 first.

Although the function unit 30 is suspended in the etching solution, displacement of the function unit 30 is inhibited by the holding layer 14. Incidentally, the electrode pads 33*a* and 34*a*, which are parts of the wiring layers 33 and 34, are exposed to the bottom surface of the function unit 30 and make contact with the etching solution. Thus, the wiring layers 33 and 34 are formed of a material (aforementioned gold or the like) not eroded by the etching solution.

After the removal of the first sacrificial layer 11 and the second sacrificial layer 13, the function unit 30 adheres to the surface of the substrate 10 with weak adhesion force and is held on the surface of the substrate 10. Further, a gap A is formed between the function unit 30 and the holding layer 14. With these steps, the electronic structure 1A is formed.

The function unit 30 of the electronic structure 1A is peeled off from the substrate 10 and transferred onto the transfer substrate 20 by the transfer tool 17 by a method similar to the method described with reference to FIG. 6(A) to FIG. 8(B).

Since the function unit 30 adheres to the surface of the substrate 10 with weak adhesion force, the function unit 30 can be peeled off from the substrate 10 with ease.

In order to secure high accuracy of registration (alignment) of the electrode pads 33*a* and 34*a* at the bottom surface of the function unit 30 and the wirings 21 and 22 (FIG. 9(B)) on the transfer substrate 20, the thickness of the second sacrificial layer 13 is desired to be greater than or equal to ½ of the width of each electrode pad 33*a*, 34*a* in its short-side direction (i.e., widthwise direction).

In this modification, the function unit 30 (i.e., a complex or composite body) including a plurality of elements, wiring and the like can be peeled off from the substrate 10 with ease and transferred onto the transfer substrate 20. Accordingly, the process including the transfer of the function unit 30 can be facilitated.

Further, in the step of removing the first sacrificial layer 11 and the second sacrificial layer 13, the displacement of the function unit 30 is inhibited by the holding layer 14, and thus the positional accuracy of the function unit 30 on the substrate 10 can be increased.

Second Embodiment

Figure 13:
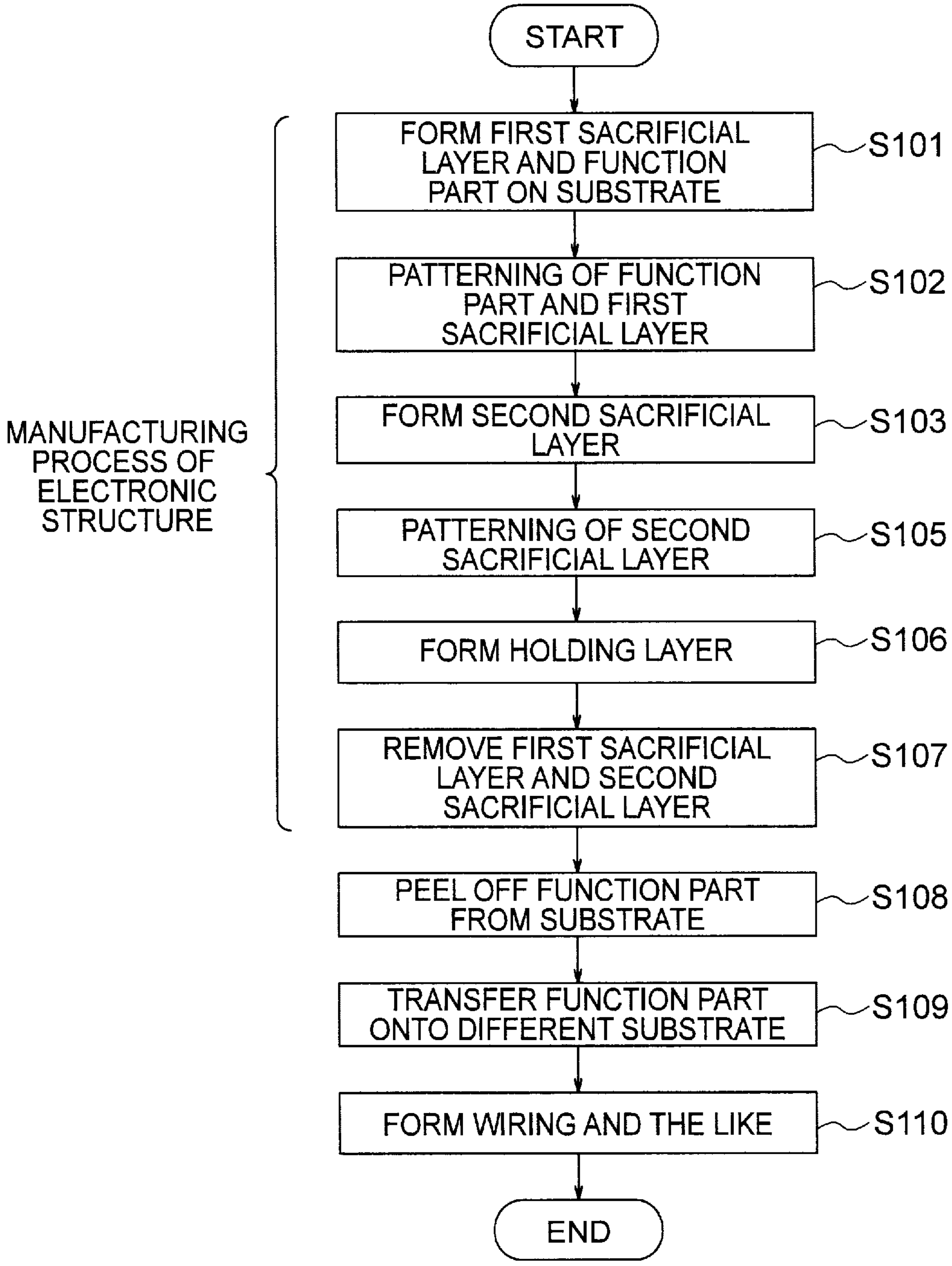
FIG. 13 is a flowchart showing a manufacturing method of an electronic structure in a second embodiment.

FIG. 13 is a flowchart showing a manufacturing method of an electronic structure 1B in a second embodiment. The second embodiment differs from the first embodiment in that the roughening (the step S104 in FIG. 1) is not executed.

Figure 14A:
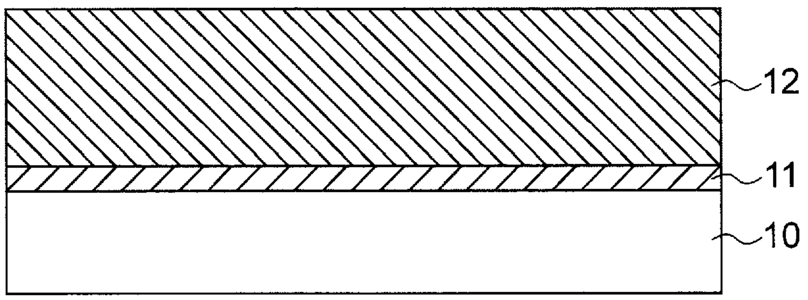
FIG. 14(A) is a cross-sectional view showing a step of forming a first sacrificial layer and a function part on a substrate in the manufacturing method of the electronic structure in the second embodiment.
Figure 14B:
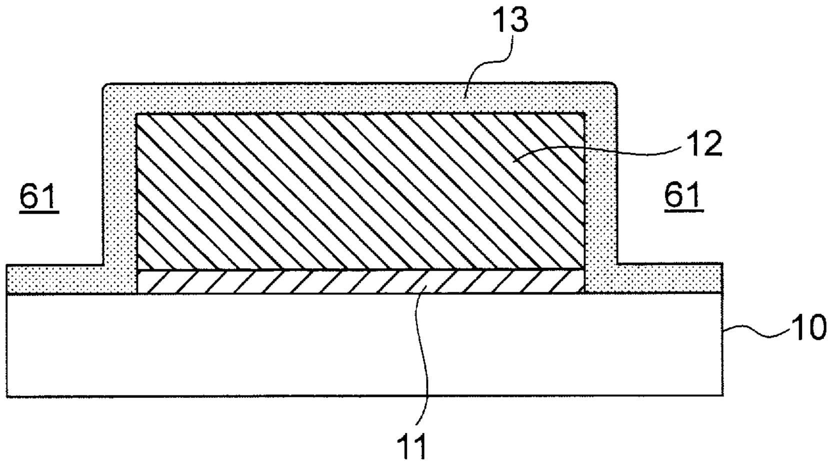
FIG. 14(B) is a cross-sectional view showing a step of forming a second sacrificial layer in the manufacturing method of the electronic structure in the second embodiment.
Figure 14C:
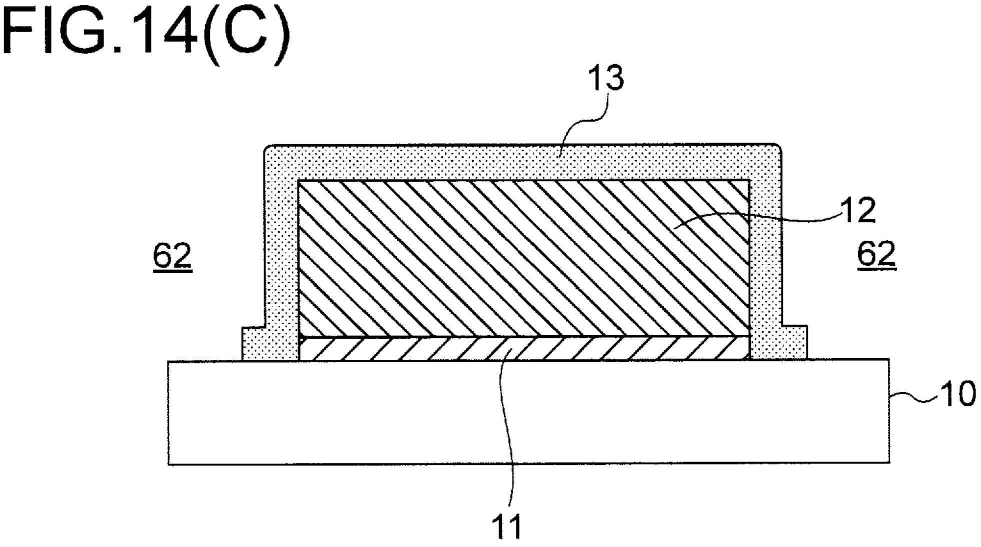
FIG. 14(C) is a cross-sectional view showing a step of patterning the second sacrificial layer in the manufacturing method of the electronic structure in the second embodiment.

FIG. 14(A) is a cross-sectional view showing a step of forming the first sacrificial layer 11 and the function part 12 on the substrate 10. FIG. 14(B) is a cross-sectional view showing a step of patterning the first sacrificial layer 11 and the function part 12 and forming the second sacrificial layer 13. FIG. 14(C) shows a step of patterning the second sacrificial layer 13.

In the step S101 (FIG. 13), as shown in FIG. 14(A), the first sacrificial layer 11 is formed on the substrate 10, and the function part 12 is formed on the first sacrificial layer 11.

In the step S102 (FIG. 13), as shown in FIG. 14(B), the separation grooves 61 exposing the surface of the substrate 10 are formed by patterning the first sacrificial layer 11 and the function part 12 by means of etching or the like. Incidentally, the substrate 10, the first sacrificial layer 11 and the function part 12 are collectively referred to as a layered substrate.

In the step S103 (FIG. 13), as shown in FIG. 14(B), the second sacrificial layer 13 extending from the surface of the substrate 10 to the function part 12 is formed.

While the roughening of the surface of the second sacrificial layer 13 was executed in the step S104 in the first embodiment, the roughening is not executed in the second embodiment.

In the step S105 (FIG. 13), as shown in FIG. 14(C), the openings 62 are formed by patterning the second sacrificial layer 13.

Figure 15A:
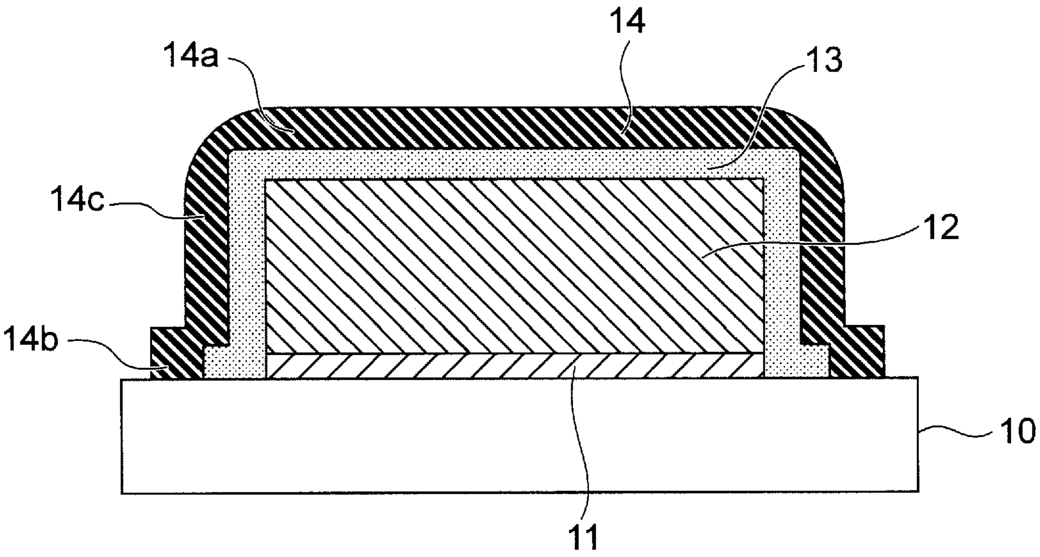
FIG. 15(A) is a cross-sectional view showing a step of forming a holding layer in the manufacturing method of the electronic structure in the second embodiment.
Figure 15B:
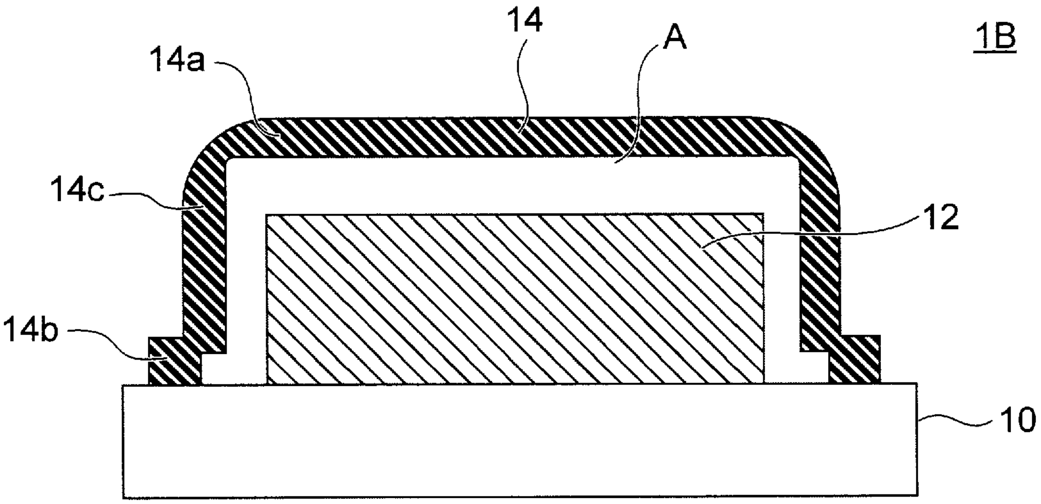
FIG. 15(B) is a cross-sectional view showing a step of removing the first sacrificial layer and the second sacrificial layer in the manufacturing method of the electronic structure in the second embodiment.

FIG. 15(A) is a cross-sectional view showing a step of forming the holding layer 14. FIG. 15(B) is a cross-sectional view showing a step of removing the first sacrificial layer 11 and the second sacrificial layer 13.

In the step S106 (FIG. 13), as shown in FIG. 15(A), the holding layer 14 extending from the surface of the substrate 10 to the second sacrificial layer 13 is formed. Since the surface of the second sacrificial layer 13 has not been roughened, the surface of the holding layer 14 in contact with the second sacrificial layer 13 is not roughened either.

In the step S107 (FIG. 13), as shown in FIG. 15(B), the first sacrificial layer 11 and the second sacrificial layer 13 are removed by means of etching. Due to the removal of the sacrificial layers 11 and 13, the function part 12 adheres to the surface of the substrate 10 with weak adhesion force and is held on the surface of the substrate 10. Further, a gap A is formed between the function part 12 and the holding layer 14. With these steps, the electronic structure 1B is obtained.

The function part 12 of the electronic structure 1B is peeled off from the substrate 10 and transferred onto the transfer substrate 20 by the transfer tool 17 by a method similar to the method described with reference to FIG. 6(A) to FIG. 8(B).

Since the function part 12 adheres to the surface of the substrate 10 with weak adhesion force as described above, the function part 12 can be peeled off from the substrate 10 with ease in the step of peeling from the substrate 10.

In the second embodiment, the surface of the holding layer 14 on the function part 12 side is not roughened. However, if the adhesion force between the holding layer 14 and the function part 12 is set to be sufficiently weaker than the joining force between the function part 12 and the surface of the transfer substrate 20 by appropriately selecting the material of the holding layer 14, the holding layer 14 can be peeled off from the transfer substrate 20 while leaving the function part 12 on the transfer substrate 20.

Third Embodiment

Figure 16:
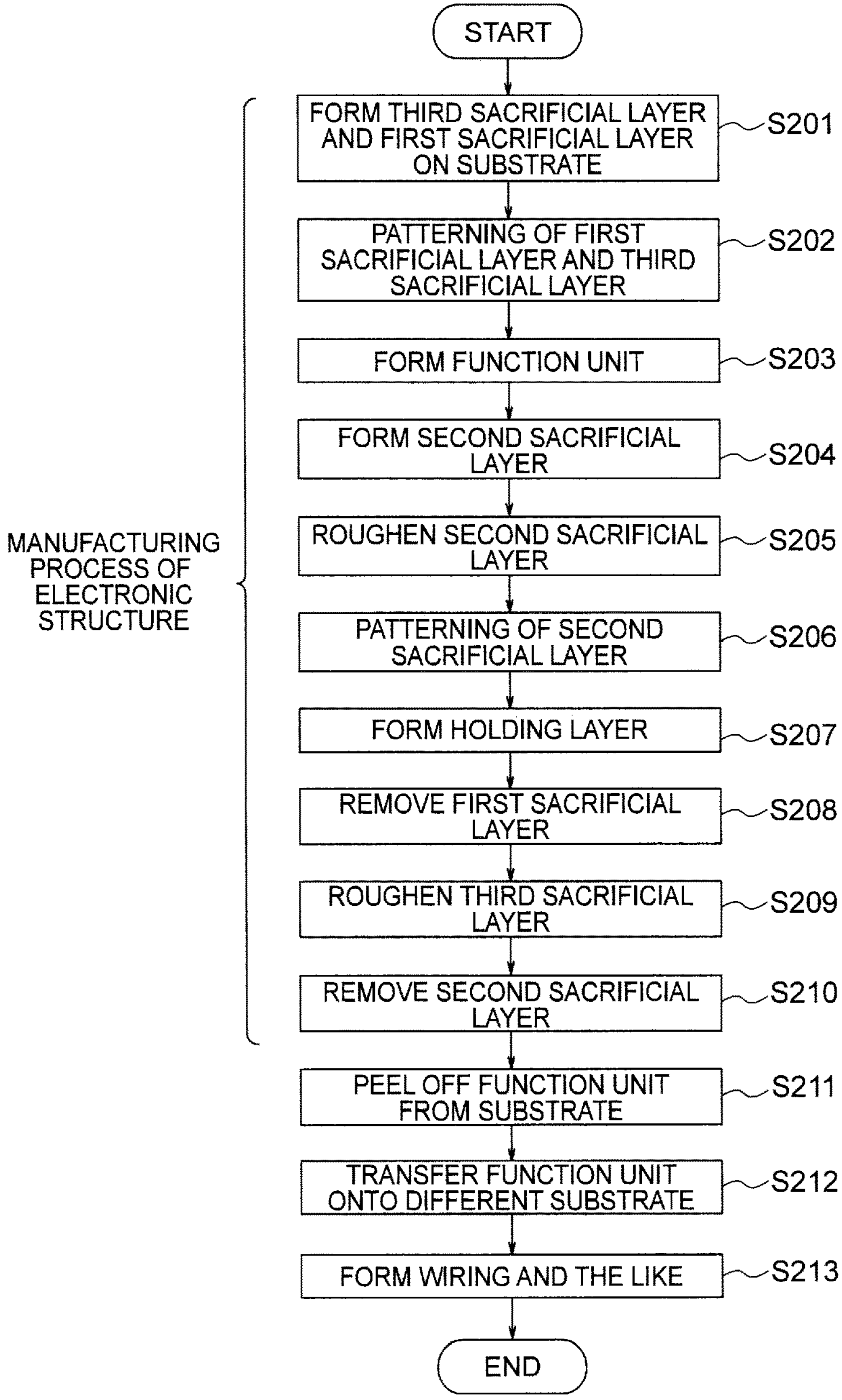
FIG. 16 is a flowchart showing a manufacturing method of an electronic structure in a third embodiment.
Figure 17A:
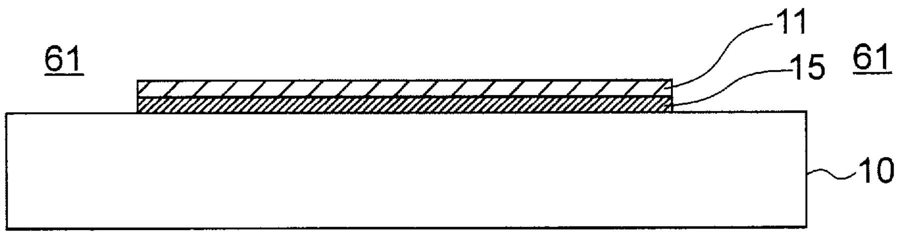
FIG. 17(A) is a cross-sectional view showing a step of forming a third sacrificial layer and a first sacrificial layer on a substrate in the manufacturing method of the electronic structure in the third embodiment.
Figure 17B:
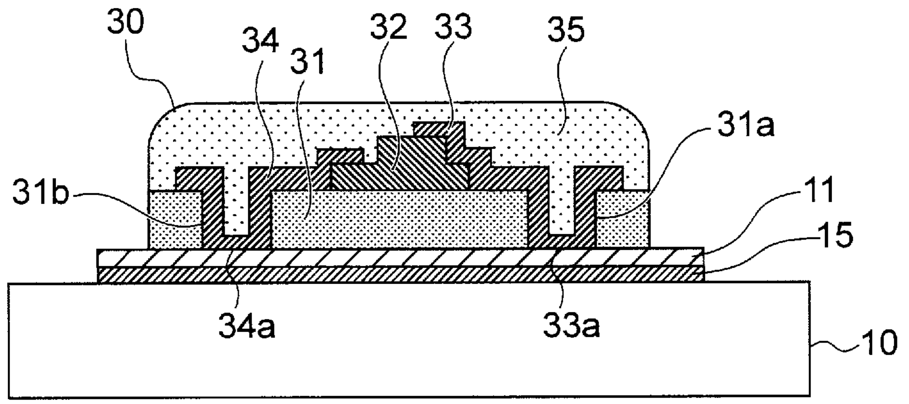
FIG. 17(B) is a cross-sectional view showing a step of forming a function unit on the first sacrificial layer in the manufacturing method of the electronic structure in the third embodiment.
Figure 17C:
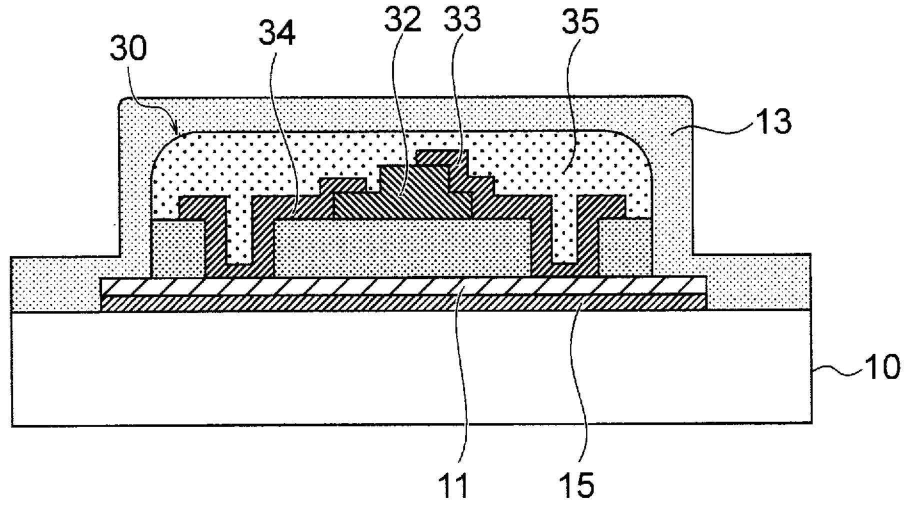
FIG. 17(C) is a cross-sectional view showing a step of forming a second sacrificial layer in the manufacturing method of the electronic structure in the third embodiment.

Next, a third embodiment will be described below. FIG. 16 is a flowchart showing a manufacturing method of an electronic structure 1C in the third embodiment. FIG. 17(A) is a cross-sectional view showing a step of forming a third sacrificial layer 15 and the first sacrificial layer 11 on the substrate 10. FIG. 17(B) is a cross-sectional view showing a step of forming the function unit 30 on the first sacrificial layer 11. FIG. 17(C) is a cross-sectional view showing a step of forming the second sacrificial layer 13.

In step S201 (FIG. 16), as shown in FIG. 17(A), the third sacrificial layer 15 is formed on the substrate 10, and the first sacrificial layer 11 is formed on the third sacrificial layer 15.

The third sacrificial layer 15 is an inorganic film or an organic film, for example. The first sacrificial layer 11 is an inorganic film or an organic film, for example. More specifically, the first sacrificial layer 11 is formed of a material that can be removed by an etching solution not eroding the third sacrificial layer 15 and the second sacrificial layer 13 which will be described later.

In step S202 (FIG. 16), as shown in FIG. 17(A), the separation grooves 61 exposing the surface of the substrate 10 are formed by patterning the third sacrificial layer 15 and the first sacrificial layer 11 by means of dry etching or the like.

In step S203 (FIG. 16), as shown in FIG. 17(B), the function unit 30 is formed on the first sacrificial layer 11. As explained in the modification of the first embodiment, the function unit 30 is a complex (composite body) including a plurality of elements and wiring layers. For example, the function unit 30 is formed on another growth substrate, peeled off from the growth substrate, and transferred onto the substrate 10.

The function unit 30 includes the base layer 31, the function layer 32, the first wiring layer 33, the second wiring layer 34, and the capsule layer 35 covering these layers. These layers are the same as those in the modification (FIG. 11(A)-FIG. 12(B)) of the first embodiment, and thus repeated description thereof is omitted here. Incidentally, the substrate 10, the third sacrificial layer 15, the first sacrificial layer 11 and the function unit 30 are collectively referred to as a layered substrate.

In step S204 (FIG. 16), as shown in FIG. 17(C), the second sacrificial layer 13 extending from the surface of the substrate 10 to the function unit 30 is formed. The second sacrificial layer 13 is an inorganic film such as $Al_2O_3$, $SiO_2$ or the like, for example. The thickness of the second sacrificial layer 13 is 100 nm, for example.

Figure 18A:
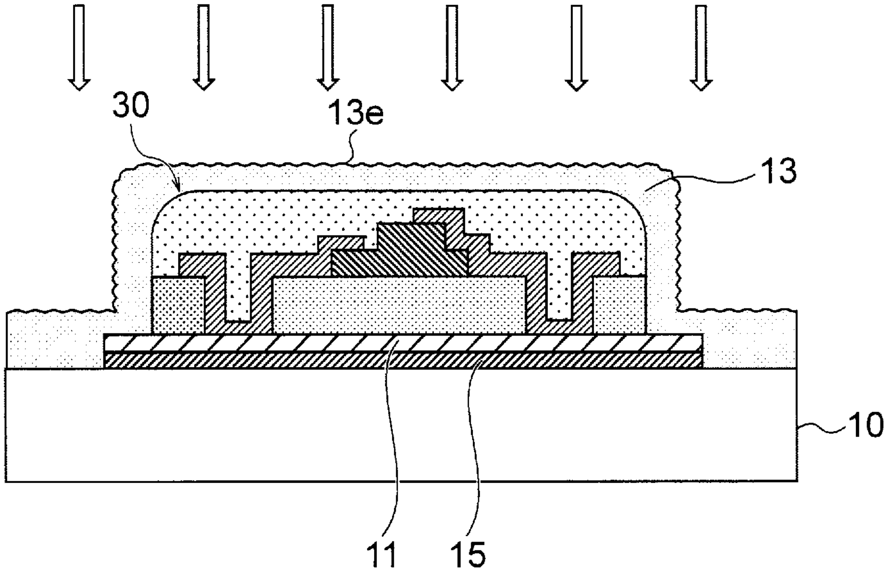
FIG. 18(A) is a cross-sectional view showing a step of roughening a surface of the second sacrificial layer in the manufacturing method of the electronic structure in the third embodiment.
Figure 18B:
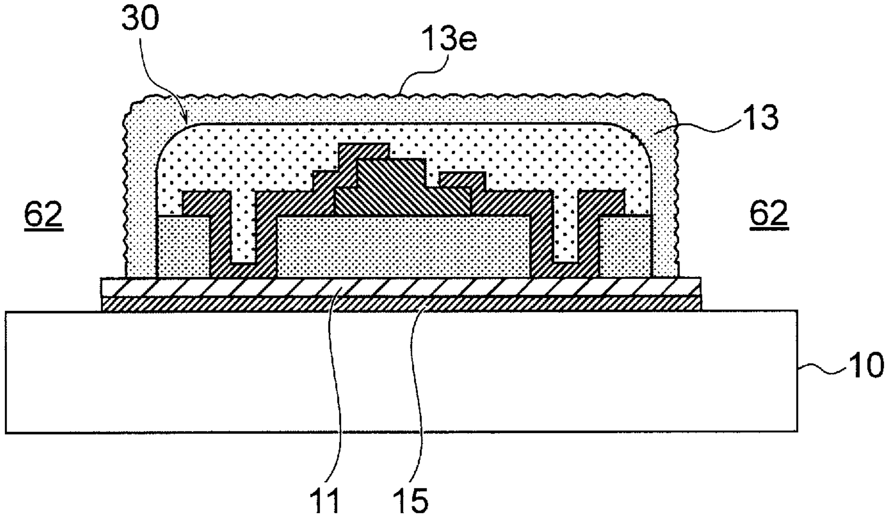
FIG. 18(B) is a cross-sectional view showing a step of patterning the second sacrificial layer in the manufacturing method of the electronic structure in the third embodiment.

FIG. 18(A) is a cross-sectional view showing a step of roughening the surface of the second sacrificial layer 13. FIG. 18(B) is a cross-sectional view showing a step of patterning the second sacrificial layer 13.

In step S205 (FIG. 16), as shown in FIG. 18(A), the surface 13*e* of the second sacrificial layer 13 is roughened. As the method of the roughening, it is possible to execute plasma processing such as ashing or to make particles of metal or the like adhere to the surface 13*e* of the second sacrificial layer 13.

In step S206 (FIG. 16), as shown in FIG. 18(B), the openings 62 are formed by patterning the second sacrificial layer 13.

Figure 19A:
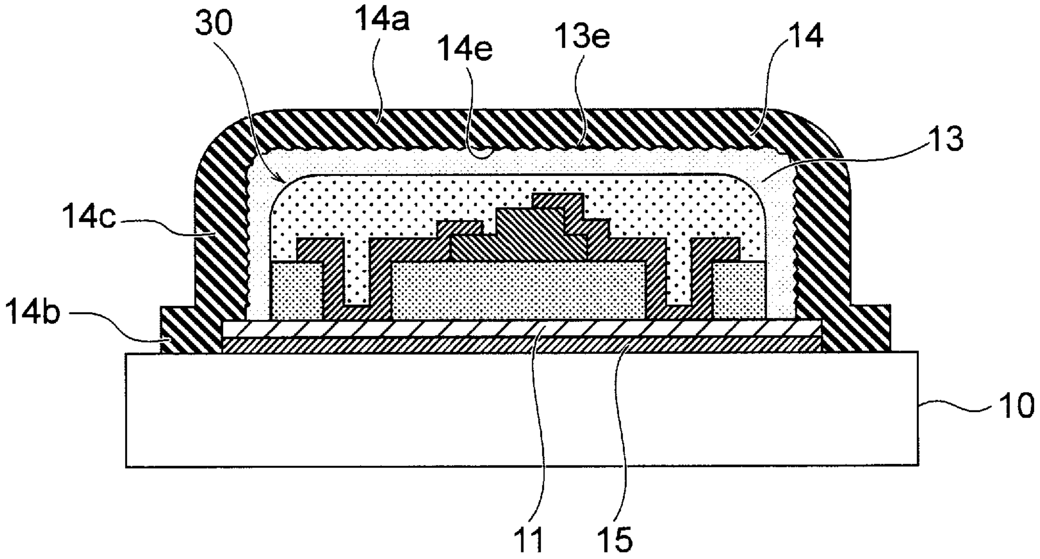
FIG. 19(A) is a cross-sectional view showing a step of forming a holding layer in the manufacturing method of the electronic structure in the third embodiment.
Figure 19B:
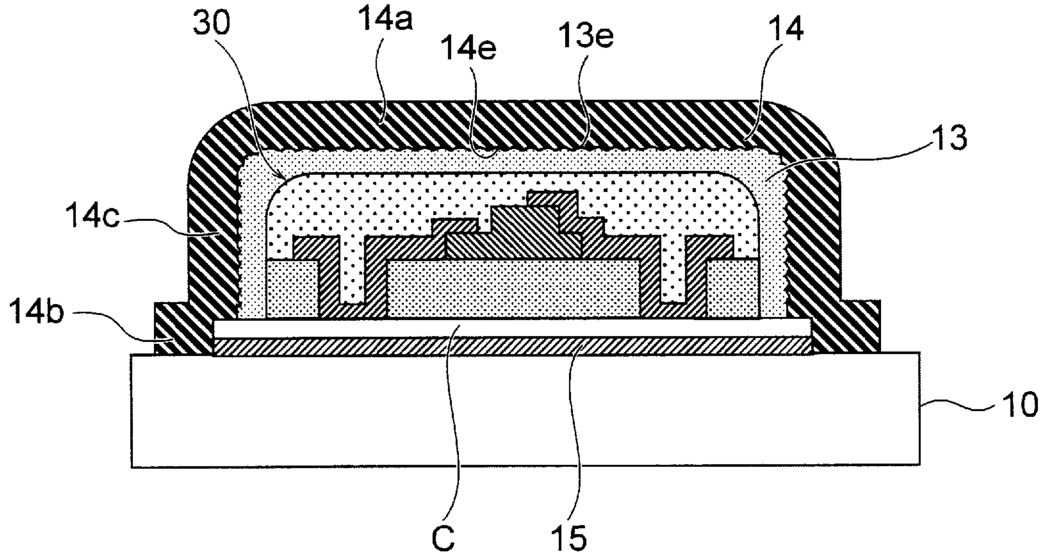
FIG. 19(B) is a cross-sectional view showing a step of removing the first sacrificial layer in the manufacturing method of the electronic structure in the third embodiment.

FIG. 19(A) is a cross-sectional view showing a step of forming the holding layer 14. FIG. 19(B) is a cross-sectional view showing a step of removing the first sacrificial layer 11.

In step S207 (FIG. 16), as shown in FIG. 19(A), the holding layer 14 as the cover layer extending from the surface of the substrate 10 to the second sacrificial layer 13 is formed. The holding layer 14 is formed of a material that is not eroded by the etching solution in a step of removing the first sacrificial layer 11 (step S208) which will be described later, such as an organic resist, for example. The surface 14*e* of the holding layer 14 in contact with the surface 13*e* of the second sacrificial layer 13 is roughened similarly to the surface 13*e* of the second sacrificial layer 13.

As shown in FIG. 19(A), the holding layer 14 includes the top part 14*a* formed on the surface of the second sacrificial layer 13, the base part 14*b* formed on the surface of the substrate 10, and the pillar part 14*c* extending between the top part 14*a* and the base part 14*b*. Further, the holding layer 14 is desirably patterned in the planer shape shown in FIG. 4(B) in the first embodiment, for example.

In step S208 (FIG. 16), as shown in FIG. 19(B), the first sacrificial layer 11 is removed by means of wet etching. Dilute hydrochloric acid or the like can be used as the etching solution.

Since the second sacrificial layer 13 is not removed even though the first sacrificial layer 11 is removed, the function unit 30 is held by the holding layer 14 via the second sacrificial layer 13. Therefore, a gap C is formed between the third sacrificial layer 15 on the substrate 10 and the function unit 30.

Figure 20A:
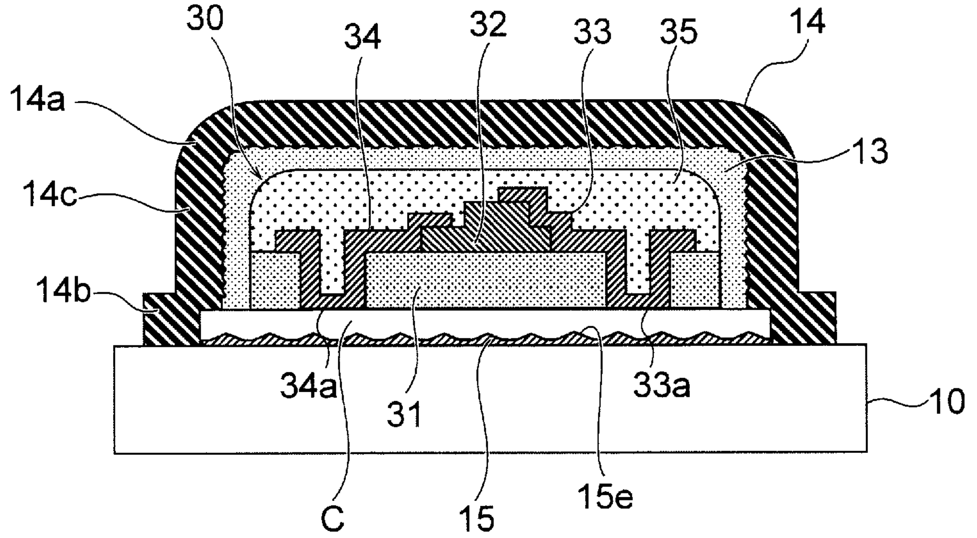
FIGS. 20(A) and 20(B) are a cross-sectional view and a plan view showing a step of roughening a surface of the third sacrificial layer in the manufacturing method d of the electronic structure in the third embodiment.
Figure 20B:
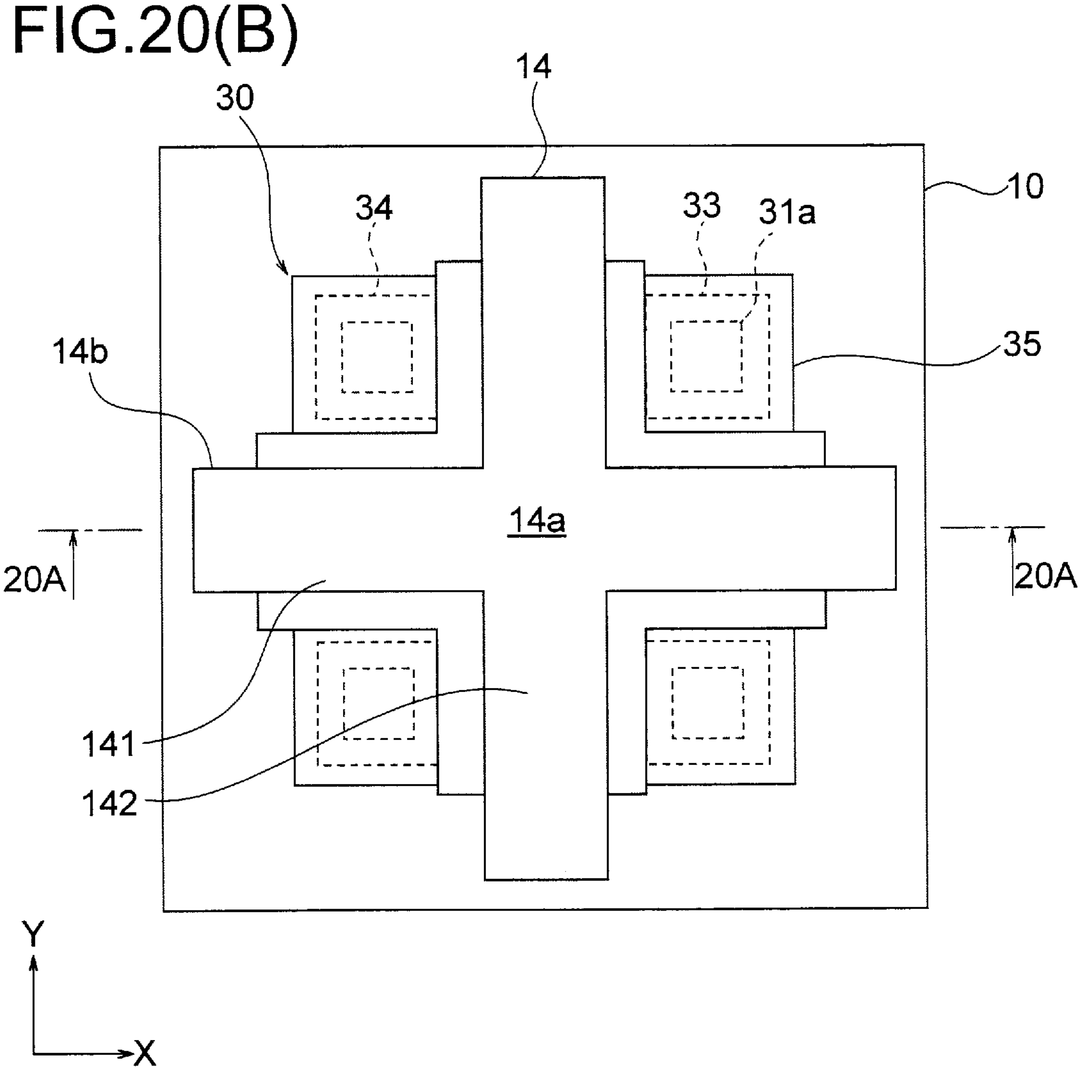

FIGS. 20(A) and 20(B) are a cross-sectional view and a plan view showing a step of roughening a surface of the third sacrificial layer 15. Incidentally, FIG. 20(A) corresponds to a cross-sectional view taken along the line 20A-20A shown in FIG. 20(B).

In step S209 (FIG. 16), as shown in FIGS. 20(A) and 20(B), the surface of the third sacrificial layer 15 is roughened. Although the surface of the third sacrificial layer 15 is situated in the narrow gap C, the roughening by means of plasma processing such as ashing is possible. Further, in cases where the third sacrificial layer 15 is formed of metal, it is also possible to roughen the surface of the third sacrificial layer 15 by means of heating.

In the case of plasma processing, it is desirable to use a material (for example, inert gas) that does not roughen the bottom surface of the function unit 30 (including the electrode pads 33*a* and 34*a*).

The roughening is executed so that the surface roughness of the third sacrificial layer 15 becomes rougher than that of the bottom surface of the base layer 31 of the function unit 30. As an example, the roughening is executed so that the surface roughness (maximum height Ry) of the third sacrificial layer 15 becomes rougher than 10 nm.

Figure 21A:
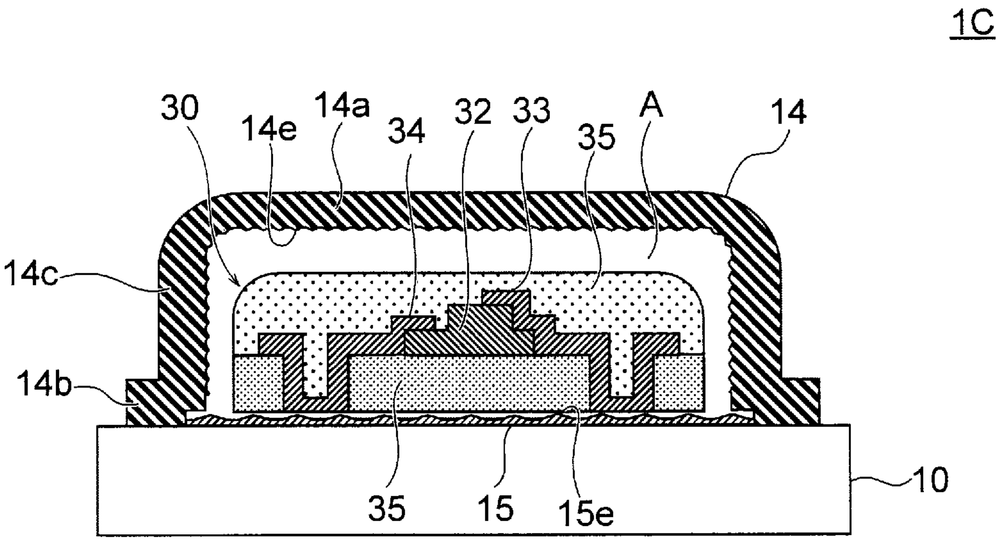
FIGS. 21(A) and 21(B) are a cross-sectional view and a plan view showing a step of removing the second sacrificial layer in the manufacturing method of the electronic structure in the third embodiment.
Figure 21B:
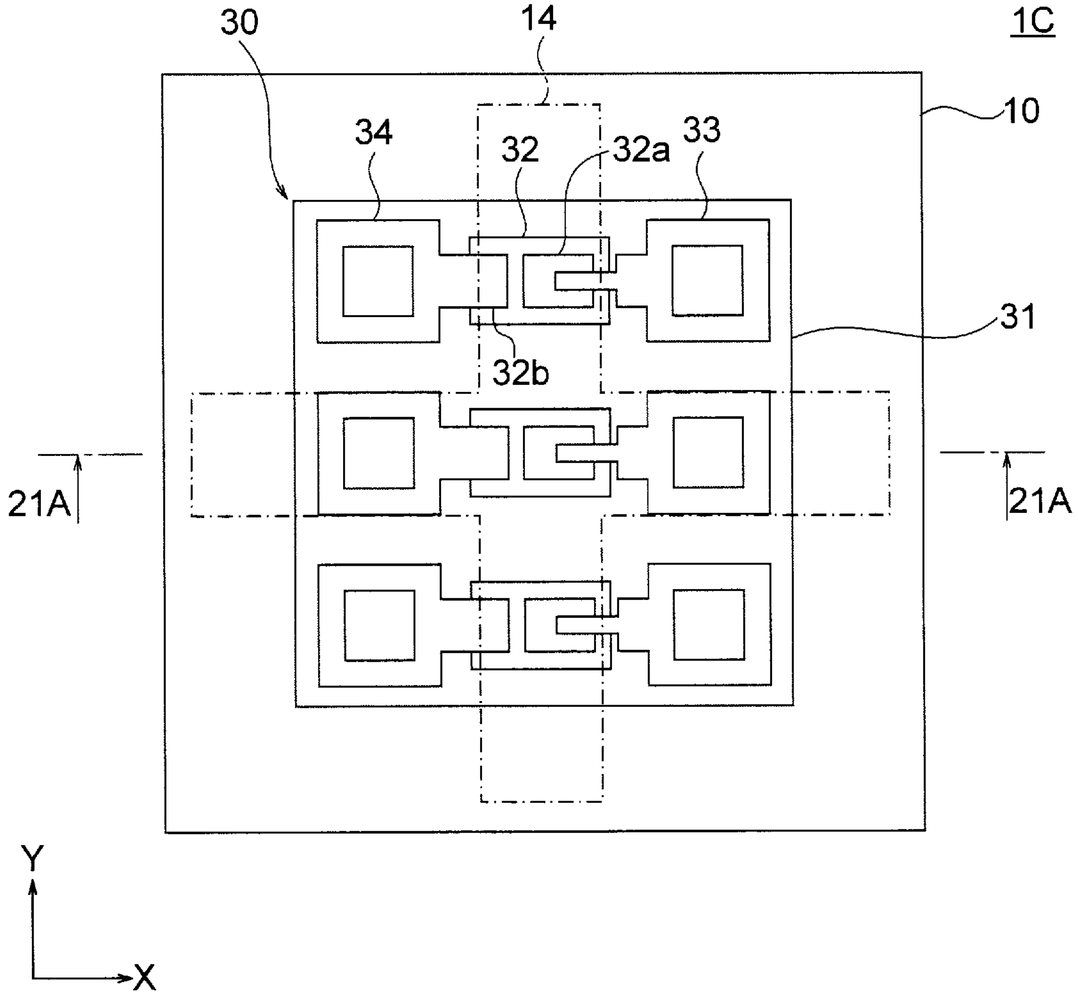

FIGS. 21(A) and 21(B) are a cross-sectional view and a plan view showing a step of removing the second sacrificial layer 13. Incidentally, FIG. 21(A) corresponds to a cross-sectional view taken along the line 21A-21A shown in FIG. 21(B). In FIG. 21(B), the holding layer 14 is indicated by broken lines.

In step S210 (FIG. 16), as shown in FIG. 21(B), the second sacrificial layer 13 is removed by means of wet etching. Phosphoric acid or the like can be used as the etching solution.

While the function unit 30 is suspended in the etching solution due to the removal of the second sacrificial layer 13, the displacement of the function unit 30 is inhibited since the holding layer 14 has been provided so as to surround the function unit 30 (FIG. 21(B)).

After the substrate 10 is taken out of the etching solution, the function unit 30 is, due to its own weight, held on the surface of the third sacrificial layer 15. Since the surface of the third sacrificial layer 15 has been roughened, the adhesion force between the third sacrificial layer 15 and the function unit 30 is extremely weak. Further, a gap A is formed between the function unit 30 and the holding layer 14.

With these steps, the electronic structure 1C including the substrate 10, the function unit 30 and the holding layer 14 and having the gap A between the function unit 30 and the holding layer 14 is obtained as shown in FIG. 21(B). The steps S201 to S210 correspond to the manufacturing process of the electronic structure 1C.

By these steps S201 to S210 and steps S211 to S213 which will be described below, an electronic device 2C is obtained.

Figure 22A:
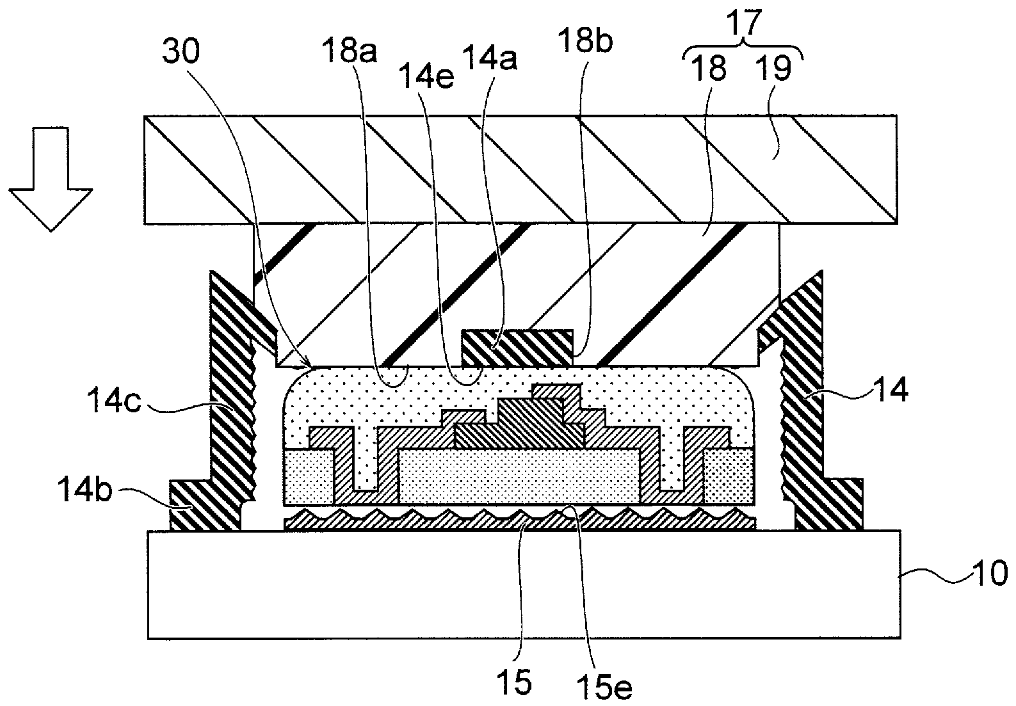
FIGS. 22(A) and 22(B) are cross-sectional views showing stepwise a step of peeling off the function unit of the electronic structure from the substrate in the third embodiment.
Figure 22B:
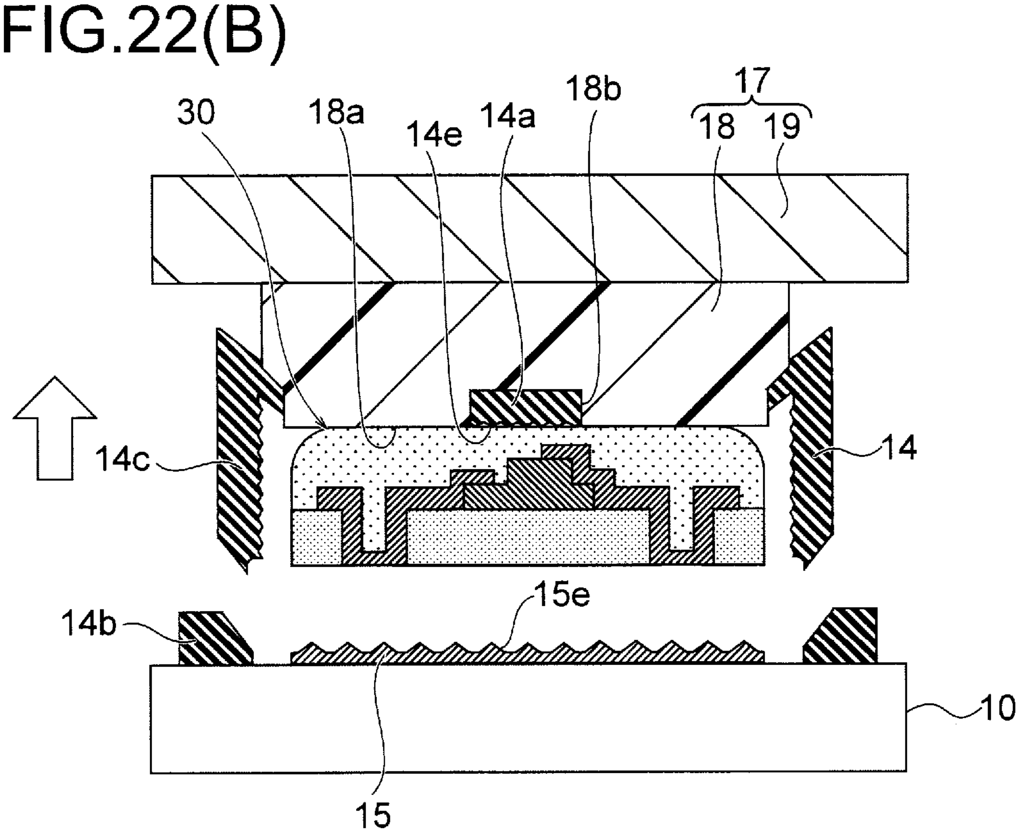

FIGS. 22(A) and 22(B) are cross-sectional views showing stepwise a step of peeling off the function unit 30 and the holding layer 14 from the substrate 10.

In step S211 (FIG. 16), the function unit 30 and the holding layer 14 are peeled off from the substrate 10 of the electronic structure 1C. The transfer tool 17 shown in FIG. 22(A) is used for the peeling. The configuration of the transfer tool 17 is as described in the first embodiment.

First, as shown in FIG. 22(A), the holding body 18 of the transfer tool 17 is pressed against the function unit 30 and the holding layer 14. The holding layer 14 is deformed by being pressed by the holding body 18 from above and makes contact with the surface of the function unit 30. However, the adhesion force between the holding layer 14 and the function unit 30 is extremely weak since the surface 14*e* of the holding layer 14 on the function unit 30 side has been roughened.

Subsequently, as shown in FIG. 22(B), the transfer tool 17 is moved in the direction away from the substrate 10. The adhesion force between the holding body 18 of the transfer tool 17 and the function unit 30 is stronger than the adhesion force between the function unit 30 and the third sacrificial layer 15. Therefore, the function unit 30 is peeled off from the substrate 10 together with the holding layer 14.

Incidentally, while the holding layer 14 is broken at the time of peeling off the function unit 30 and the base part 14*b* remains on the substrate 10 in FIG. 22(B), it is permissible even if the holding layer 14 is totally separated from the substrate 10.

Figure 23A:
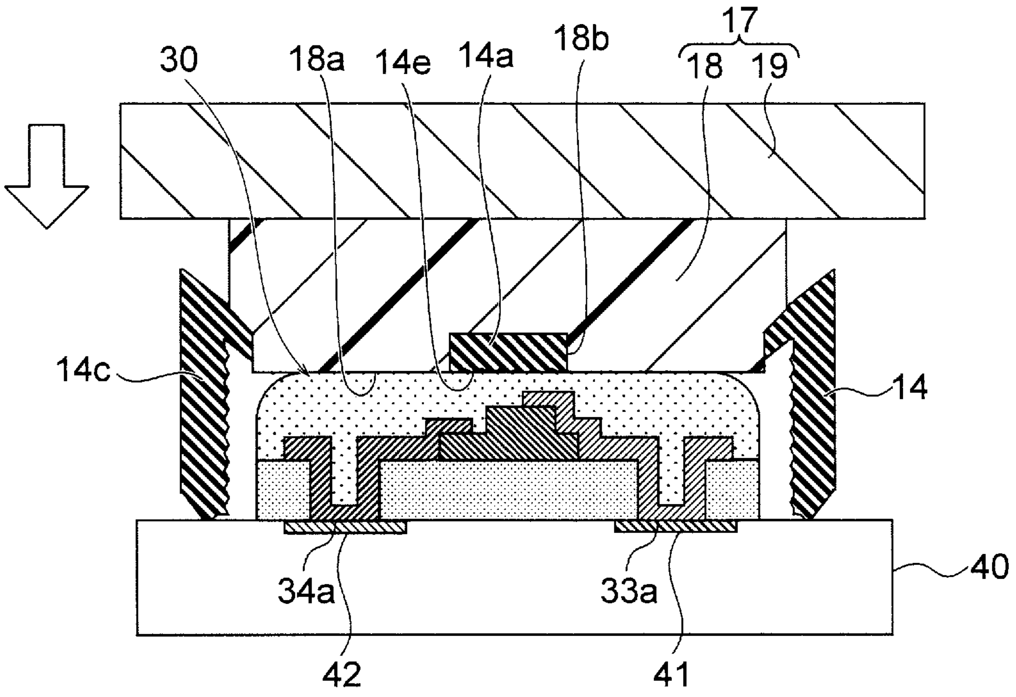
FIGS. 23(A) and 23(B) are cross-sectional views showing stepwise a step of transferring the function unit of the electronic structure onto a transfer substrate in the third embodiment.
Figure 23B:
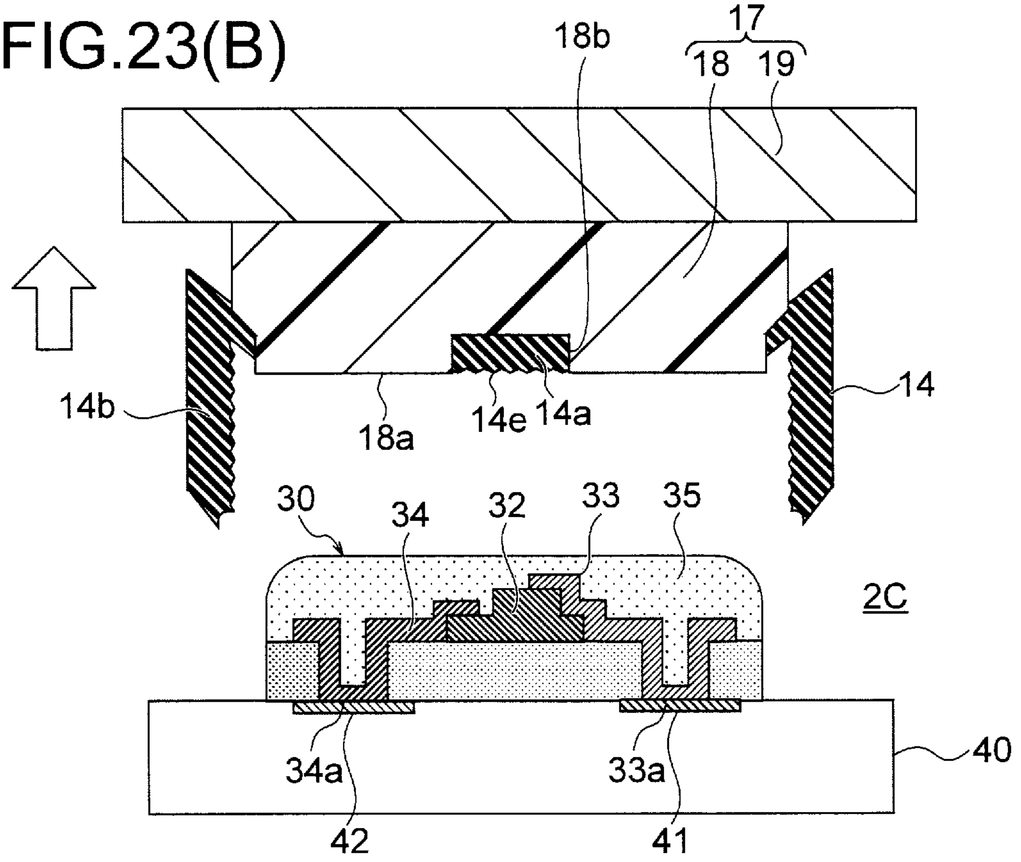

FIGS. 23(A) and 23(B) are cross-sectional views showing stepwise a step of transferring the function unit 30 onto a transfer substrate 40 different from the substrate 10. While the transfer substrate 40 is configured similarly to the transfer substrate 20 described in the first embodiment, wirings 41 and 42 have previously been formed on the transfer substrate 40.

In step S212 (FIG. 16), as shown in FIG. 23(A), the transfer tool 17 is moved to a position above the transfer substrate 40, and the function unit 30 held by the transfer tool 17 is pressed against the transfer substrate 40.

The bottom surface of the function unit 30 and the surface of the transfer substrate 40 are smooth surfaces with surface roughness (maximum height Ry) smaller than or equal to 10 nm. Thus, by performing predetermined pressing and heating, the bottom surface of the function unit 30 and the surface (i.e., top surface) of the transfer substrate 40 are joined together by intermolecular force, that is, strong joining force.

Assuming that the extending direction of the wirings 41 and 42 on the transfer substrate 40 is the Y direction, the function unit 30 is transferred onto the transfer substrate 40 so that three elements (each including the function layer 32 and the wiring layers 33 and 34) are arranged in the Y direction.

In the aforementioned step of removing the second sacrificial layer 13 (step S210), the displacement of the function unit 30 is inhibited by the holding layer 14, by which misalignment of the electrode pads 33*a* and 34*a* of the function unit 30 and the wirings 41 and 42 of the transfer substrate 40 can be reduced to a minimum.

Thereafter, as shown in FIG. 23(B), the transfer tool 17 is moved in the direction away from the transfer substrate 40.

The joining force between the bottom surface of the function unit 30 and the surface of the transfer substrate 40 is stronger than the adhesion force between the holding body 18 of the transfer tool 17 and the function unit 30 and the holding layer 14. Further, the adhesion force between the holding layer 14 and the function unit 30 is weak since the surface 14*e* of the holding layer 14 on the function unit 30 side has been roughened.

Accordingly, the function unit 30 remains being joined to the transfer substrate 40, and the holding layer 14 separates from the transfer substrate 40 together with the transfer tool 17.

With these steps, the electronic device 2C in which the function unit 30 is arranged on the transfer substrate 40 is obtained. When voltage from a non-illustrated drive circuit is applied to the wiring layers 33 and 34 via the wirings 41 and 42, light of the red color, the green color and the blue color is respectively emitted from the three elements of the function unit 30.

As described above, in the third embodiment, the surface of the third sacrificial layer 15 on the substrate 10 is roughened after removing the first sacrificial layer 11. After the second sacrificial layer 13 is removed, the function unit 30 is held on the roughened surface of the third sacrificial layer 15, and thus the adhesion force between the function unit 30 and the third sacrificial layer 15 is weak. Therefore, in the peeling step, the function unit 30 can be peeled off from the third sacrificial layer 15 with ease.

Incidentally, while an example using the function unit 30 has been described here, it is also possible to use the function part 12 described in the first embodiment instead of the function unit 30. Further, it is permissible even if the roughening of the second sacrificial layer 13 is not executed as described in the second embodiment.

Fourth Embodiment

Figure 24A:
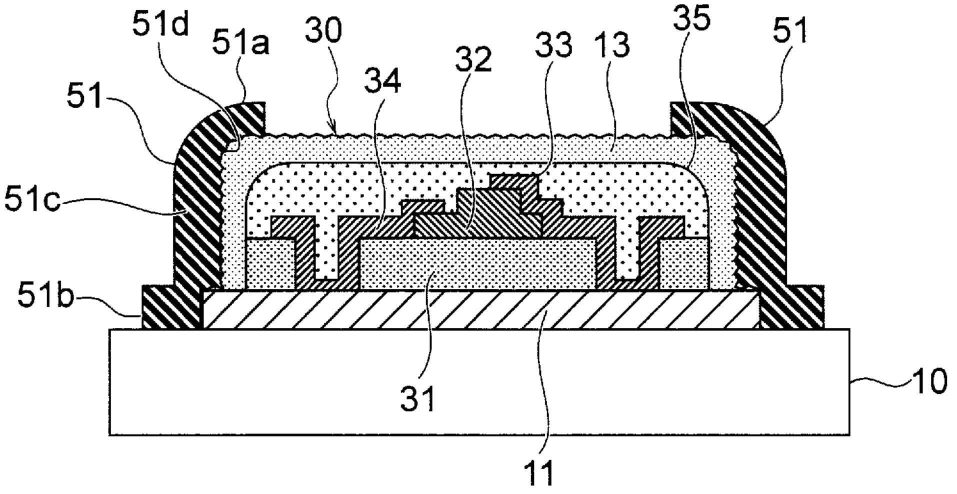
FIGS. 24(A) and 24(B) are a cross-sectional view and a plan view showing a state in which a first sacrificial layer, a function unit, a second sacrificial layer and holding layers are formed on a substrate in a manufacturing method of an electronic structure in a fourth embodiment.
Figure 24B:
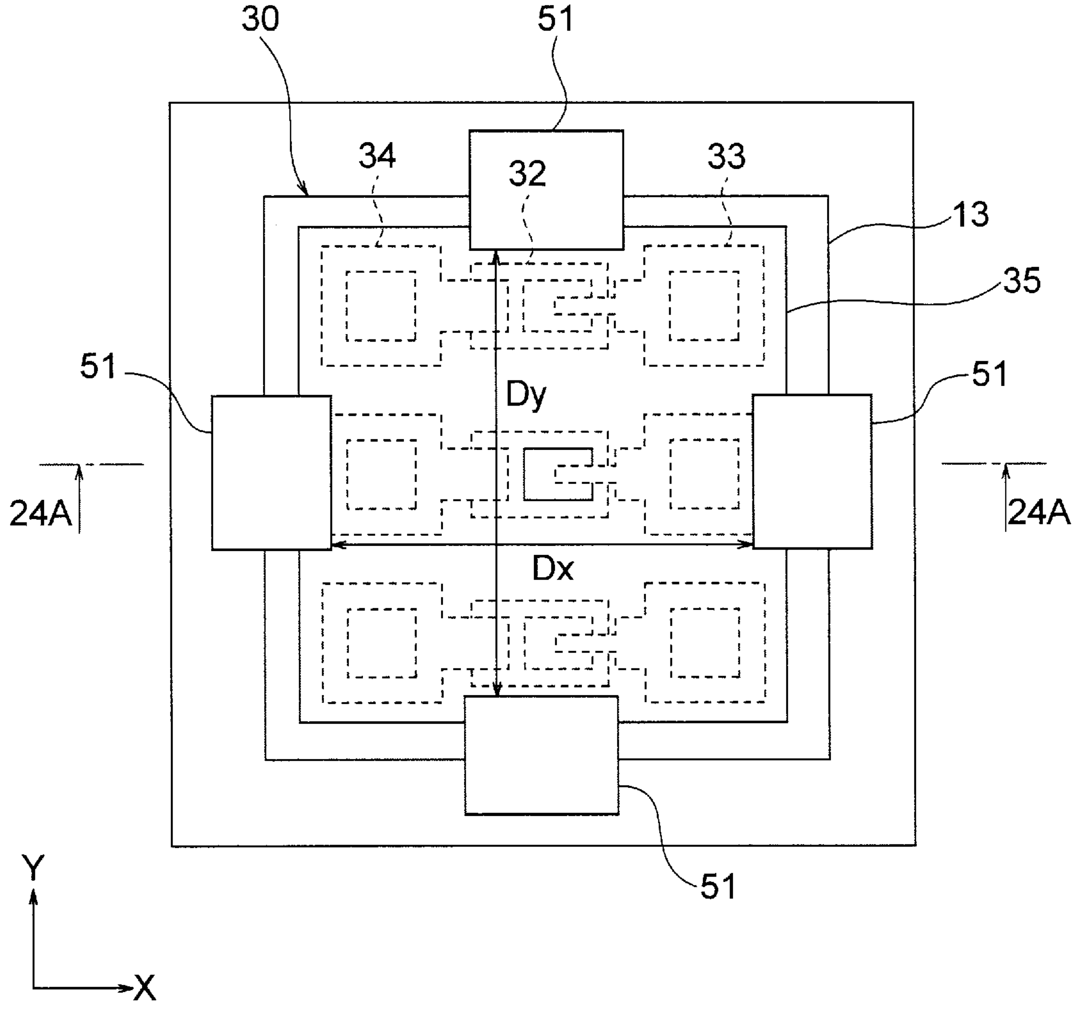

Next, a fourth embodiment will be described below. FIGS. 24(A) and 24(B) are a cross-sectional view and a plan view showing a state in which the first sacrificial layer 11, the function unit 30, the second sacrificial layer 13 and holding layers 51 are formed on the substrate 10 in a manufacturing method of an electronic structure 1D in the fourth embodiment.

In the fourth embodiment, a plurality of holding layers 51 as cover layers arranged along an outer periphery of the function unit 30 are used instead of the holding layer 14 in the first embodiment. In this example, four holding layers 51 are respectively arranged at four sides of the function unit 30 as shown in FIG. 24(B).

In other words, holding layers 51 are respectively arranged at positions for sandwiching the function unit 30 from both sides in the X direction and from both sides in the Y direction. Incidentally, the positions of the holding layers 51 are not limited to the four sides of the function unit 30. The holding layers 51 may be arranged at four corners of the function unit 30, for example. Each holding layer 51 is formed of an organic resist, for example.

It is desirable that the holding layers 51 do not reach a central region of the function unit 30 in a top view. With such a configuration, in a step of peeling off the function unit 30 (FIG. 26(A)), the holding body 18 of the transfer tool 17 can be brought into contact with the function unit 30 alone, without having the holding body 18 make contact with the holding layers 51.

As shown in FIG. 24(A), each holding layer 51 includes a top part 51*a* situated on the surface of the second sacrificial layer 13, a base part 51*b* formed on the substrate 10, and a pillar part 51*c* extending between the top part 51*a* and the base part 51*b*. A corner part 51*d* between the top part 51*a* and the pillar part 51*c* follows a curved shape of a corner part 30*a* of the capsule layer 35 of the function unit 30, and is formed in a similar curved shape.

As shown in FIG. 24(B), a minimum distance Dx between the top parts 51*a* of two holding layers 51 facing each other in the X direction is shorter than the width of the function unit 30 in the X direction. Similarly, a minimum distance Dy between the top parts 51*a* of holding layers 51 facing each other in the Y direction is shorter than the width of the function unit 30 in the Y direction.

Figure 25A:
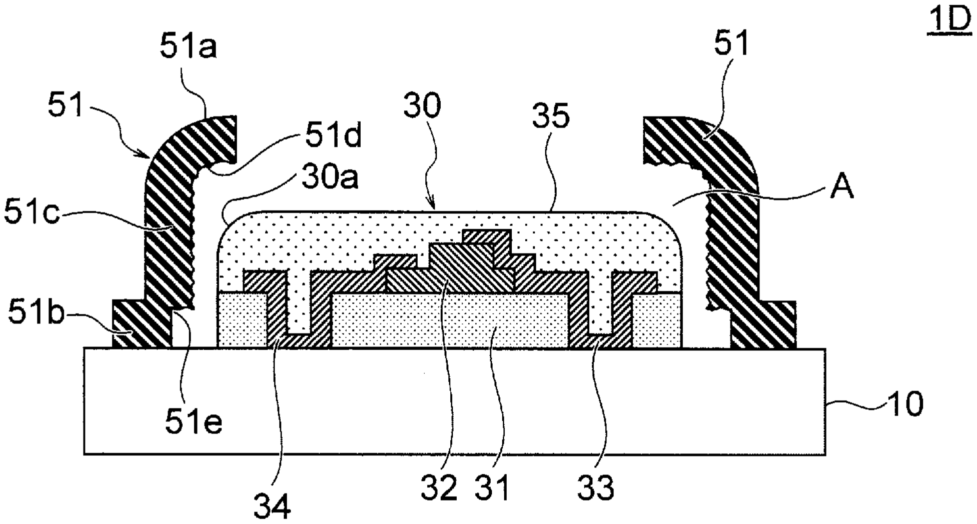
FIGS. 25(A) and 25(B) are a cross-sectional view and a plan view showing the electronic structure in the fourth embodiment.
Figure 25B:
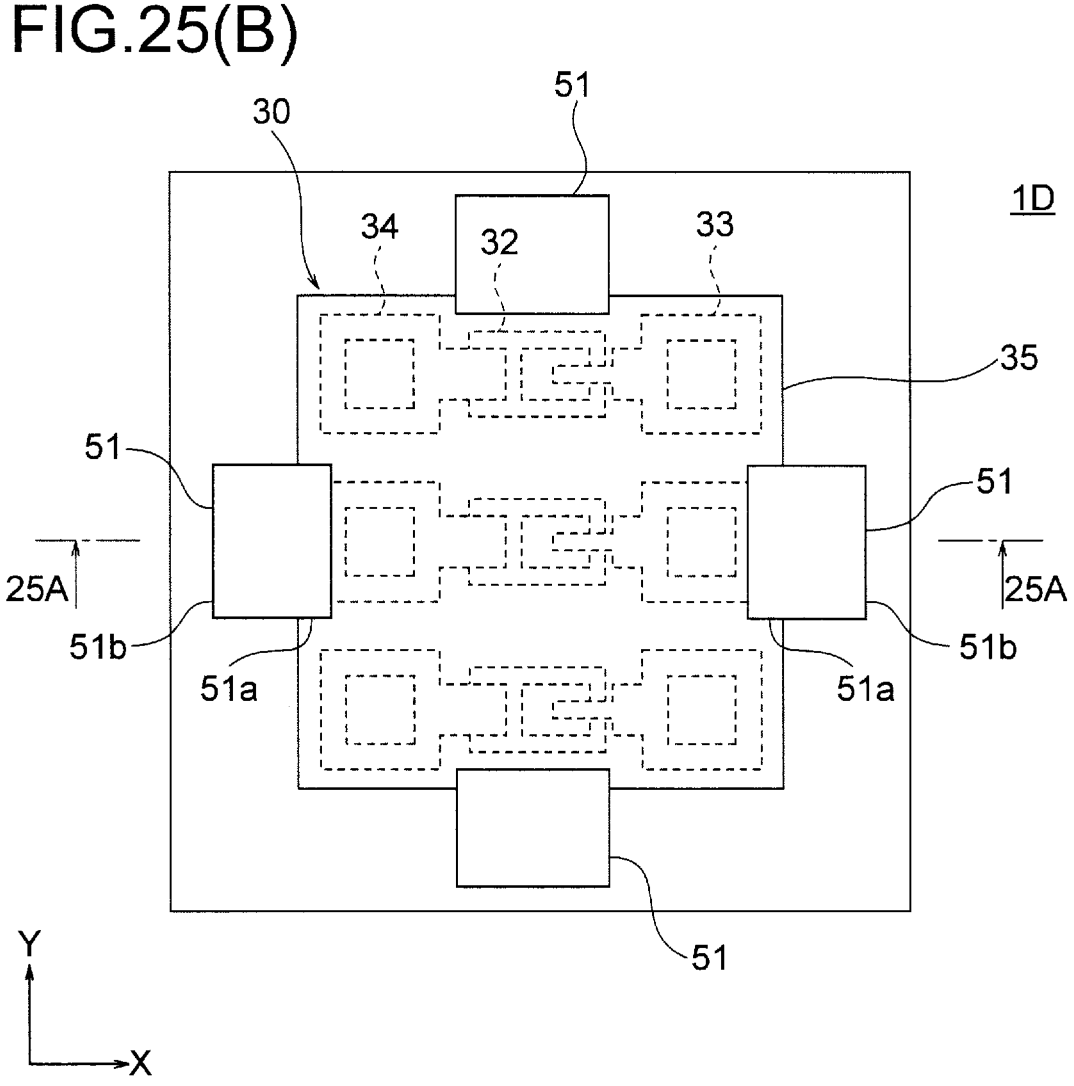

FIGS. 25(A) and 25(B) are a cross-sectional view and a plan view showing a step of removing the first sacrificial layer 11 and the second sacrificial layer 13 by means of wet etching. Incidentally, FIG. 25(A) corresponds to a cross-sectional view taken along the line 25A-25A shown in FIG. 25(B).

In the step of removing the first sacrificial layer 11 and the second sacrificial layer 13, the function unit 30 is suspended in the etching solution. However, since the function unit 30 is surrounded by the plurality of holding layers 51 as shown in FIG. 25(A), the displacement of the function unit 30 in a plane parallel to the surface of the substrate 10 is inhibited and displacement of the function unit 30 in the direction orthogonal to the surface of the substrate 10 is also restricted.

Due to the removal of the first sacrificial layer 11 and the second sacrificial layer 13, the function unit 30 is held in the state of adhering to the surface of the substrate 10 with weak adhesion force. Further, a gap A is formed between the function unit 30 and each holding layer 51. With these steps, the electronic structure 1D is obtained.

Figure 26A:
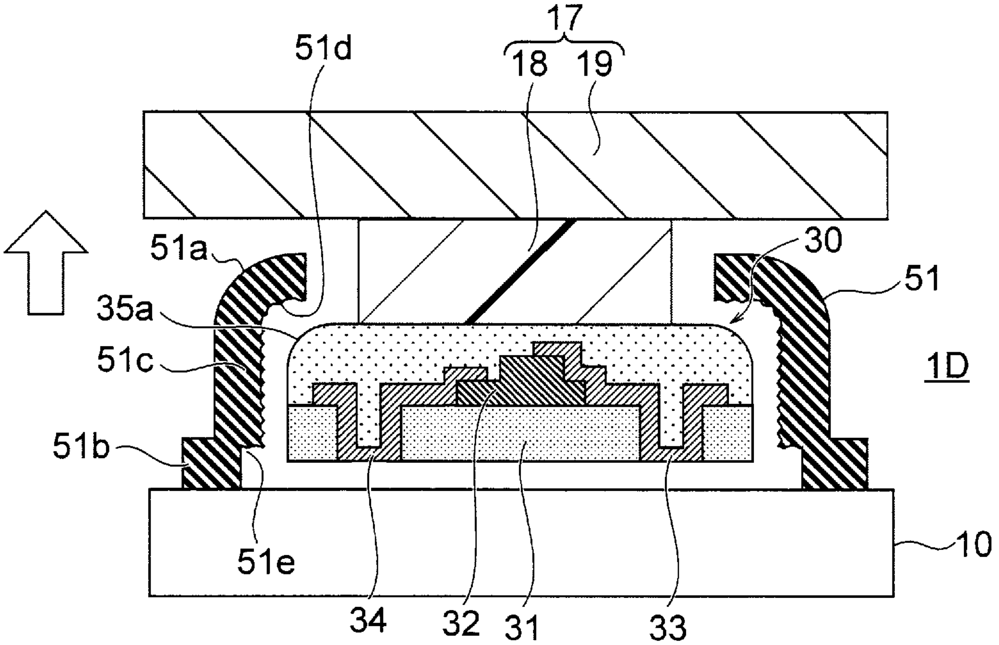
FIGS. 26(A) and 26(B) are cross-sectional views showing stepwise a step of peeling off the function part of the electronic structure from the substrate in the fourth embodiment.
Figure 26B:
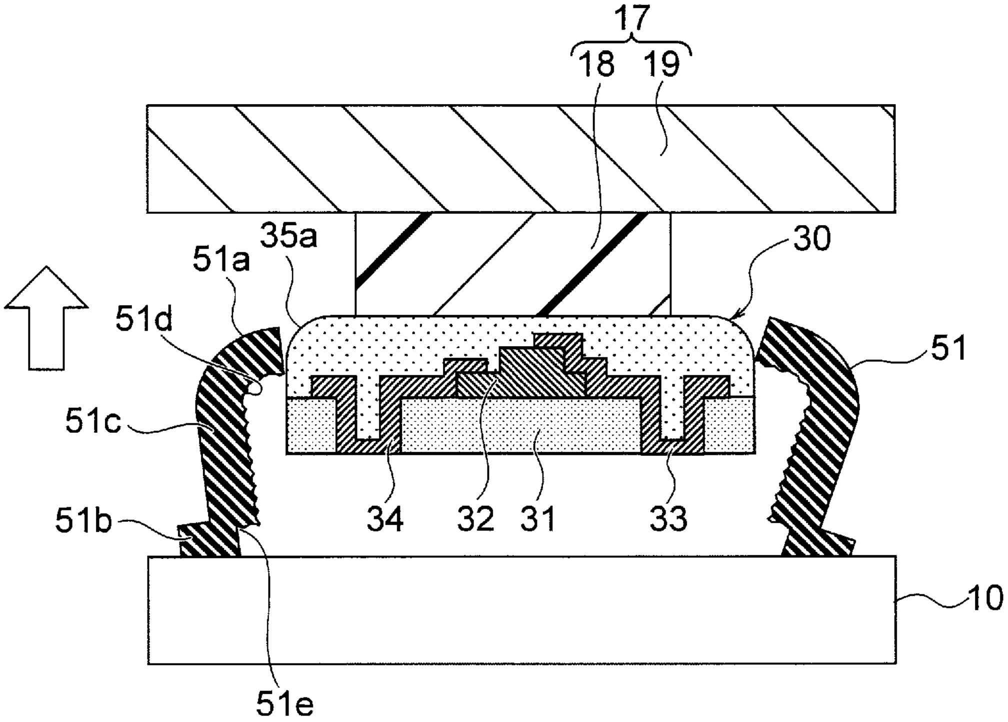

FIGS. 26(A) and 26(B) are cross-sectional views showing stepwise a step of peeling off the function unit 30 of the electronic structure 1D from the substrate 10. The transfer tool 17 described in the first embodiment is used for the peeling of the function unit 30.

The holding body 18 of the transfer tool 17 is pressed against the upper surface of the function unit 30. Since the top parts 51*a* of the holding layers 51 do not reach the central region of the function unit 30, the holding body 18 can be brought into contact with the function unit 30 alone, without having the holding body 18 make contact with the holding layers 51.

As shown in FIG. 26(A), when the transfer tool 17 is moved in the direction away from the substrate 10, the function unit 30 is peeled off from the substrate 10.

As shown in FIG. 26(B), when the transfer tool 17 is moved further in the direction away from the substrate 10, curved surfaces 35*a* of the corner parts of the capsule layer 35 of the function unit 30 make contact with the top parts 51*a* of the holding layers 51 and push the holding layers 51 outward.

The holding layers 51 are formed of an organic resist and have elasticity and flexibility to some extent, and thus are capable of elastic deformation when they are pushed by the function unit 30. Therefore, the function unit 30 can be separated from the substrate 10 without breaking the holding layers 51.

The transfer of the function unit 30 onto the transfer substrate 40 is as described with reference to FIGS. 23(A) and 23(B) in the third embodiment. However, since the holding layers 51 do not adhere to the transfer tool 17, the function unit 30 can be transferred onto the transfer substrate 40 with ease.

In the fourth embodiment, the transfer tool 17 can be reused since the holding layers 51 do not remain on the transfer tool 17.

While the description here has been given of an example in which four holding layers 51 are arranged around the function unit 30, the number of holding layers 51 is not limited to four and it is sufficient that the number is two or more. For example, it is possible to provide holding layers 51 at three sides of the function unit 30.

Further, the function part 12 in the first embodiment may be used instead of the function unit 30. Furthermore, the third sacrificial layer 15 described in the third embodiment may be provided. The substrate 10, the third sacrificial layer 15, the first sacrificial layer 11 and the function unit 30 (or the function part 12) are collectively referred to as a layered substrate.

As described above, in the fourth embodiment, since a plurality of holding layers (cover layers) 51 arranged to be separate from each other are used, the displacement of the function unit 30 at the time of removing the sacrificial layers 11 and 13 can be prevented and the transfer tool 17 can be brought into contact with the function unit 30 alone. Thus, the process including the transfer can be facilitated. Further, the holding layers 51 do not remain on the transfer tool 17 and thus it is possible to reuse the transfer tool 17.

Incidentally, it is also possible to use the function part 12 described in the first embodiment instead of the function unit 30. Further, it is permissible even if the roughening of the second sacrificial layer 13 is not executed as described in the second embodiment. Furthermore, it is also possible to provide the third sacrificial layer 15 and execute the roughening of the third sacrificial layer 15 as described in the third embodiment.

While preferred embodiments have been described specifically above, the present disclosure is not limited to the above-described embodiments and a variety of improvements or modifications are possible.

The present disclosure is applicable to manufacturing methods of electronic devices such as piezoelectric devices, photoelectric conversion devices, switching elements and power devices.

In the following, various modes according to the present disclosure will be described together as appendixes.

Appendix 1

A manufacturing method of an electronic structure, comprising:

- forming a second sacrificial layer extending from a substrate to a function part of a layered substrate including the substrate, a first sacrificial layer formed on the substrate, and the function part formed on the first sacrificial layer;
- forming a cover layer extending from the substrate to the second sacrificial layer; and
- removing the first sacrificial layer and the second sacrificial layer.

Appendix 2

The manufacturing method of an electronic structure according to appendix 1, comprising, before forming the second sacrificial layer,

- forming the first sacrificial layer on the substrate; and
- forming the function part on the first sacrificial layer.

Appendix 3

The manufacturing method of an electronic structure according to appendix 1 or 2, wherein when the first sacrificial layer the second sacrificial layer are removed, the function part and the substrate come into contact with each other due to removal of the first sacrificial layer and the second sacrificial layer.

Appendix 4

The manufacturing method of an electronic structure according to any one of appendixes 1 to 3, wherein a surface roughness of a surface of the cover layer on the function part side is made rougher than a surface roughness of a surface of the function part on the substrate side.

Appendix 5

The manufacturing method of an electronic structure according to any one of appendixes 1 to 4, wherein the layered substrate includes a third sacrificial layer between the substrate and the first sacrificial layer, and

- wherein removal the first sacrificial layer and the second sacrificial layer includes:
- removing the first sacrificial layer;
- causing a surface roughness of a surface of the third sacrificial layer on a side opposite to the substrate to be rougher than a surface roughness of a surface of the function part on the substrate side; and
- removing the second sacrificial layer.

Appendix 6

The manufacturing method of an electronic structure according to appendix 5, wherein when the second sacrificial layer is removed, the function part and the third sacrificial layer come into contact with each other due to removal of the second sacrificial layer.

Appendix 7

The manufacturing method of an electronic structure according to any one of appendixes 1 to 4, wherein the first sacrificial layer and the second sacrificial layer are removed by using a same etching material when the first sacrificial layer and the second sacrificial layer are removed.

Appendix 8

The manufacturing method of an electronic structure according to any one of appendixes 1 to 6, wherein when the first sacrificial layer and the second sacrificial layer are removed, one of the first sacrificial layer and the second sacrificial layer is removed by using a predetermined etching material and thereafter the other of the first sacrificial layer and the second sacrificial layer is removed by using an etching material different from the predetermined etching material.

Appendix 9

The manufacturing method of an electronic structure according to any one of appendixes 1 to 8, wherein a plurality of cover layers are formed along an outer periphery of the function part when the cover layer is formed.

Appendix 10

An electronic structure comprising:

- a substrate;

a function part formed on the substrate; and a cover layer formed on the substrate to surround the function part, wherein a gap is formed between the function part and the cover layer.

Appendix 11

The electronic structure according to appendix 10, wherein a surface roughness of a surface of the cover layer on the function part side is rougher than a surface roughness of a surface of the function part on the substrate side.

Appendix 12

The electronic structure according to appendix 10 or 11, comprising a sacrificial layer between the substrate and the function part, wherein a surface roughness of a surface of the sacrificial layer on a side opposite to the substrate is rougher than a surface roughness of a surface of the function part on the substrate side.

Appendix 13

The electronic structure according to any one of appendixes 10 to 13, wherein a plurality of the cover layers are formed along an outer periphery of the function part.

Appendix 14

A manufacturing method of an electronic device, comprising:

forming a second sacrificial layer extending from a substrate to a function part of a layered substrate including the substrate, a first sacrificial layer formed on the substrate, and the function part formed on the first sacrificial layer;

forming a cover layer extending from the substrate to the second sacrificial layer;

peeling off the function part from the substrate after the first sacrificial layer and the second removing sacrificial layer; and transferring the function part onto another substrate different from the substrate.

Appendix 15

The manufacturing method of an electronic device according to appendix 14, wherein the cover layer is peeled off from the substrate together with the function part when the function part is peeled off from the substrate.

Appendix 16

The manufacturing method of electronic device according to appendix 14, wherein the function part is peeled off from the substrate while deforming the cover layer when the function part is peeled off from the substrate.

DESCRIPTION OF REFERENCE CHARACTERS

1, 1A, 1B, 1C, 1D: electronic structure, 2, 2C: electronic device, 10: substrate (first substrate), 11: first sacrificial layer, 12: function part, 13: second sacrificial layer, 13*e*: surface, 14: holding layer (cover layer), 14*e*: surface, 15: third sacrificial layer (sacrificial layer, third sacrificial layer), 17: transfer tool, 18: holding body, 19: support substrate, 20, 40: transfer substrate (second substrate), 30: function unit (function part), 31: base layer, 32: function layer, 33: first wiring layer, 33*a*, 34*a*: electrode pad, 34: second wiring layer, 35: capsule layer (cover layer), 51: holding layer (cover layer)

What is claimed is:

1. A manufacturing method of an electronic structure, comprising:

forming a second sacrificial layer extending from a substrate to a function part of a layered substrate including the substrate, a first sacrificial layer formed on the substrate, and the function part formed on the first sacrificial layer;

forming a cover layer extending from the substrate to the second sacrificial layer; and removing the first sacrificial layer and the second sacrificial layer.

2. The manufacturing method of an electronic structure according to claim 1, comprising, before forming the second sacrificial layer, forming the first sacrificial layer on the substrate; and forming the function part on the first sacrificial layer.

3. The manufacturing method of an electronic structure according to claim 1, wherein when the first sacrificial layer and the second sacrificial layer are removed, the function part and the substrate come into contact with each other due to removal of the first sacrificial layer and the second sacrificial layer.

4. The manufacturing method of an electronic structure according to claim 1, wherein a surface roughness of a surface of the cover layer on the function part side is made rougher than a surface roughness of a surface of the function part on the substrate side.

5. The manufacturing method of an electronic structure according to claim 1, wherein the layered substrate includes a third sacrificial layer between the substrate and the first sacrificial layer, and wherein removal of the first sacrificial layer and the second sacrificial layer includes:

removing the first sacrificial layer;

causing a surface roughness of a surface of the third sacrificial layer on a side opposite to the substrate to be rougher than a surface roughness of a surface of the function part on the substrate side; and removing the second sacrificial layer.

6. The manufacturing method of an electronic structure according to claim 5, wherein when the second sacrificial layer is removed, the function part and the third sacrificial layer come into contact with each other due to removal of the second sacrificial layer.

7. The manufacturing method of an electronic structure according to claim 1, wherein the first sacrificial layer and the second sacrificial layer are removed by using a same etching material when the first sacrificial layer and the second sacrificial layer are removed.

8. The manufacturing method of an electronic structure according to claim 1, wherein when the first sacrificial layer and the second sacrificial layer are removed, one of the first sacrificial layer and the second sacrificial layer is removed by using a predetermined etching material and thereafter the other of the first sacrificial layer and the second sacrificial layer is removed by using an etching material different from the predetermined etching material.

9. The manufacturing method of an electronic structure according to claim 1, wherein a plurality of cover layers are formed along an outer periphery of the function part when the cover layer is formed.

10. A manufacturing method of an electronic device, comprising:

forming a second sacrificial layer extending from a substrate to a function part of a layered substrate including the substrate, a first sacrificial layer formed on the substrate, and the function part formed on the first sacrificial layer;

forming a cover layer extending from the substrate to the second sacrificial layer;

peeling off the function part from the substrate after removing the first sacrificial layer and the second sacrificial layer; and transferring the function part onto another substrate different from the substrate.

11. The manufacturing method of an electronic device according to claim 10, wherein the cover layer is peeled off from the substrate together with the function part when the function part is peeled off from the substrate.

12. The manufacturing method of an electronic device according to claim 10, wherein the function part is peeled off from the substrate while deforming the cover layer when the function part is peeled off from the substrate.

* * * * *